United States Patent
Soga et al.

(10) Patent No.: US 11,719,745 B2
(45) Date of Patent: Aug. 8, 2023

(54) METHOD OF OPERATING SEMICONDUCTOR DEVICE

(71) Applicant: FUJITSU LIMITED, Kawasaki (JP)

(72) Inventors: Ikuo Soga, Isehara (JP); Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/899,662

(22) Filed: Aug. 31, 2022

(65) Prior Publication Data
US 2022/0413039 A1    Dec. 29, 2022

Related U.S. Application Data

(62) Division of application No. 16/911,439, filed on Jun. 25, 2020, now Pat. No. 11,506,707.

(30) Foreign Application Priority Data

Jul. 11, 2019  (JP) .................................. 2019-129338

(51) Int. Cl.
*G01R 31/28* (2006.01)
*H01L 23/66* (2006.01)

(52) U.S. Cl.
CPC .......... *G01R 31/2884* (2013.01); *H01L 23/66* (2013.01); *H01L 2223/6611* (2013.01);
(Continued)

(58) Field of Classification Search
CPC ............ G01R 31/2884; G01R 31/2896; G01R 31/3004; G01R 31/3842; H01L 23/66;
(Continued)

(56) References Cited

U.S. PATENT DOCUMENTS

2002/0167083 A1* 11/2002 Chaki .................... H01L 24/49
257/784
2014/0175453 A1    6/2014 Yamada
(Continued)

FOREIGN PATENT DOCUMENTS

JP    2015-23360 A    2/2015

OTHER PUBLICATIONS

USPTO, (Gondarenko) Final Office Action, dated Jul. 20, 2022, in parent U.S. Appl. No. 16/911,439 [pending].
(Continued)

*Primary Examiner* — Natalia A Gondarenko
(74) *Attorney, Agent, or Firm* — Fujitsu Patent Center

(57) ABSTRACT

A semiconductor device includes: a substrate; a circuit element disposed on a first surface side of the substrate; a first transmission line disposed on the first surface side; a first terminal disposed on the first surface side; a first dielectric disposed in a part of the first transmission line; a second terminal disposed on a side of the first dielectric opposite to the first transmission line; a second transmission line disposed on the first surface side and has one end coupled to the circuit element; a third terminal disposed on the first surface side and coupled to the other end of the second transmission line; a second dielectric disposed in a part of the second transmission line; a fourth terminal disposed on a side of the second dielectric opposite to the second transmission line; and a conductor disposed on a second surface side of the substrate.

1 Claim, 22 Drawing Sheets

(52) U.S. Cl.
CPC .............. *H01L 2223/6616* (2013.01); *H01L 2223/6677* (2013.01)

(58) Field of Classification Search
CPC ............... H01L 23/647; H01L 23/62; H01L 2223/6611; H01L 2223/6616; H01L 2223/6677; H01L 2223/6683; H01L 2223/6672; H01L 2223/6644; H01L 2223/6661; H01L 27/0605; H01L 27/0727; H01L 27/0705; H01L 27/0711; H01L 2027/11885; H01L 2027/11837; H01L 2027/1184; H01L 2027/11883; H01L 25/0652; H01L 25/115
USPC ............... 257/76, 194; 324/762.01; 438/172
See application file for complete search history.

(56) References Cited

U.S. PATENT DOCUMENTS

| | | |
|---|---|---|
| 2015/0234003 A1 | 8/2015 | Shiozaki et al. |
| 2016/0150632 A1 | 5/2016 | Viswanathan et al. |
| 2017/0162525 A1 | 6/2017 | Takagi |
| 2020/0105881 A1 | 4/2020 | Ramaswamy et al. |

OTHER PUBLICATIONS

USPTO, (Gondarenko) Non Final Office Action, dated May 2, 2022, in parent U.S. Appl. No. 16/911,439 [pending].
USPTO, (Gondarenko) Requirement for Restriction/Election, dated Apr. 1, 2022, in parent U.S. Appl. No. 16/911,439 [pending].

* cited by examiner

METHOD OF OPERATING SEMICONDUCTOR DEVICE

CROSS-REFERENCE TO RELATED APPLICATION

This application is a divisional of application Ser. No. 16/911,439, filed Jun. 25, 2020, which is based upon and claims the benefit of priority of the prior Japanese Patent Application No. 2019-129338, filed on Jul. 11, 2019, the entire contents of which are incorporated herein by reference.

FIELD

The embodiments discussed herein are related to a semiconductor device, a semiconductor module, and a method of operating a semiconductor device.

BACKGROUND

Regarding semiconductor devices, there is known a technology for performing examination or failure analysis by disposing test wiring in addition to circuit wiring such as a power supply line and a signal line in a module substrate in which a signal processing integrated circuit (IC) is mounted, and detecting a voltage, a current, a signal level, and the like by bringing a probe into contact with a text terminal at one end of the test wiring.

Examples of the related art include Japanese Laid-open Patent Publication No. 2015-23360.

SUMMARY

According to an aspect of the embodiments, a semiconductor device includes: a substrate; a circuit element disposed on a first surface side of the substrate; a first transmission line that is disposed on the first surface side of the substrate and has one end coupled to the circuit element; a first terminal that is disposed on the first surface side of the substrate and coupled to the other end of the first transmission line and into which a first direct current voltage and a first alternating current signal for examination or a second direct current voltage for operation are input; a first dielectric that is disposed in a part of the first transmission line on a side opposite to the substrate; a second terminal that is disposed on a side of the first dielectric opposite to the first transmission line so as not to protrude from the first transmission line in a plan view and into which a second alternating current signal for operation is input; a second transmission line that is disposed on the first surface side of the substrate and has one end coupled to the circuit element; a third terminal that is disposed on the first surface side of the substrate and coupled to the other end of the second transmission line and from which a first output signal of the circuit element at a time of input of the first direct current voltage and the first alternating current signal into the first terminal is output; a second dielectric that is disposed in a part of the second transmission line on a side opposite to the substrate; a fourth terminal that is disposed on a side of the second dielectric opposite to the second transmission line so as not to protrude from the second transmission line in a plan view and from which a second output signal of the circuit element at a time of input of the second direct current voltage into the first terminal and input of the second alternating current signal into the second terminal is output; and a conductor that is disposed on a second surface side of the substrate opposite to the first surface and set to a ground electric potential.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In a semiconductor device, two types of terminal groups including a terminal coupled in a direct current manner to a transmission line linked to a circuit element inside the semiconductor device and a terminal coupled by alternating current through capacitance may be disposed. In such a semiconductor device, depending on a method of using the terminal groups at the time of arrangement, examination, and subsequent operation of the transmission line and the two types of terminal groups coupled to the transmission line in direct current and alternating current manners, input and output of the circuit element may not be appropriately performed due to an effect of a parasitic component occurring between the terminal groups and a conductor set to a ground electric potential. In this case, appropriate characteristic evaluation and operation of the circuit element and the semiconductor device including the circuit element may not be easily performed.

In one aspect, a semiconductor device in which an effect of a parasitic component is suppressed and appropriate input and output are performed may be implemented.

First, one example of a semiconductor device will be described.

Figure 1:
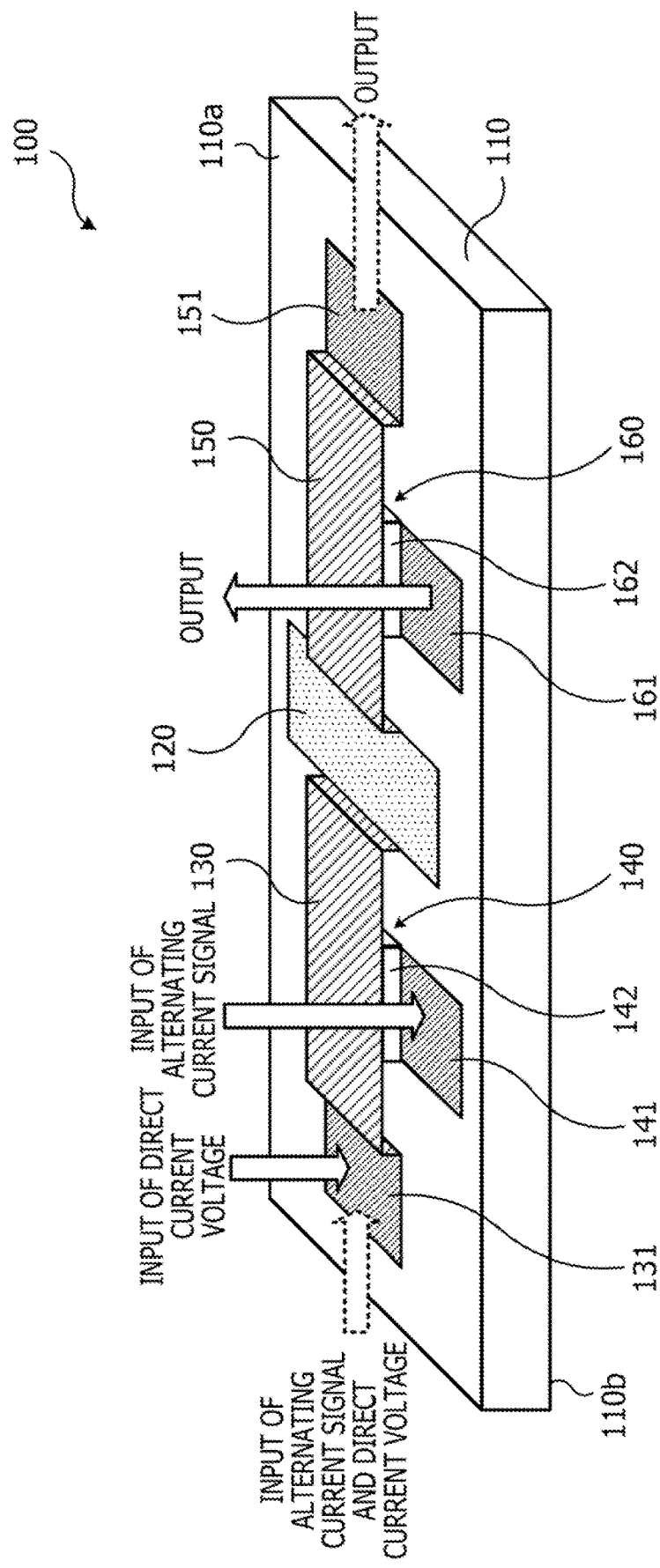
FIG. 1 is a diagram for describing one example of a semiconductor device.

FIG. 1 is a diagram for describing one example of the semiconductor device. In FIG. 1, a main perspective view of one example of the semiconductor device is schematically illustrated. In FIG. 1, one example of input and output at the time of examination and operation of the semiconductor device is schematically illustrated together.

A semiconductor device 100 illustrated in FIG. 1 includes a substrate 110 and a circuit element 120 disposed over the substrate 110. The substrate 110 is a substrate in which various semiconductor materials such as silicon (Si) or various compound semiconductor materials such as gallium nitride (GaN) are used. The circuit element 120 is a semiconductor element such as a transistor or an integrated circuit having a predetermined function such as amplification. For example, the circuit element 120 is formed on one surface (outer surface) 110a of the substrate 110.

The semiconductor device 100 further includes a transmission line 130 that is disposed over the substrate 110 and coupled to the circuit element 120. For example, one end of the transmission line 130 is coupled to an input terminal (gate terminal or the like of a transistor) of the circuit element 120. A terminal 131 is disposed at another end of the transmission line 130 of which one end is coupled to the circuit element 120. Capacitance 140 (capacitor) is disposed in the middle of the transmission line 130 linking the circuit element 120 to the terminal 131. The capacitance 140 includes a dielectric 142 that is disposed below a part of the transmission line 130, a conductive layer (conductive layer 143, described later, in FIG. 18A), not illustrated in FIG. 1, that is disposed below the dielectric 142, and a terminal 141 that is extracted to a side (in a direction intersecting with an extending direction of the transmission line 130) of the transmission line 130 from the conductive layer. Various conductive materials, for example, metal materials such as copper (Cu) and aluminum (Al), are used in the transmission line 130 and the terminal 131, and the conductive layer of the capacitance 140 and the terminal 141. Various dielectric materials, for example, dielectric materials such as silicon oxide (SiO), silicon nitride (SiN), and silicon carbide (SiC), are used in the dielectric 142 of the capacitance 140. For example, the capacitance 140 is MIM capacitance having a metal-insulator-metal (MIM) structure in which a part of the transmission line 130 is set as an upper electrode, the conductive layer to which the terminal 141 is linked is set as a lower electrode, and the dielectric 142 is interposed between the upper electrode and the lower electrode.

The semiconductor device 100 further includes a transmission line 150 that is disposed over the substrate 110 and coupled to the circuit element 120. For example, one end of the transmission line 150 is coupled to an output terminal (drain terminal or the like of a transistor) of the circuit element 120. A terminal 151 is disposed at another end of the transmission line 150 of which one end is coupled to the circuit element 120. Capacitance 160 (capacitor) is disposed in the middle of the transmission line 150 linking the circuit element 120 to the terminal 151. The capacitance 160 includes a dielectric 162 that is disposed below a part of the transmission line 150, a conductive layer (not illustrated in FIG. 1) that is disposed below the dielectric 162, and a terminal 161 that is extracted to a side (in a direction intersecting with an extending direction of the transmission line 150) of the transmission line 150 from the conductive layer. Various conductive materials, for example, metal materials such as Cu and Al, are used in the transmission line 150 and the terminal 151, and the conductive layer of the capacitance 160 and the terminal 161. Various dielectric materials, for example, dielectric materials such as SiO, SiN, and SiC, are used in the dielectric 162 of the capacitance 160. For example, the capacitance 160 is MIM capacitance in which a part of the transmission line 150 is set as an upper electrode, the conductive layer to which the terminal 161 is linked is set as a lower electrode, and the dielectric 162 is interposed between the upper electrode and the lower electrode.

In the semiconductor device 100, a wiring layer having a conductive portion such as wiring, a via, and the like coupled to the circuit element 120 and an insulating portion covering the conductive portion is formed over the substrate 110 in which the circuit element 120 is formed. The transmission line 130 and the terminal 131, the conductive layer (lower electrode) of the capacitance 140 and the terminal 141, the transmission line 150 and the terminal 151, the conductive layer (lower electrode) of the capacitance 160 and the terminal 161 are one example of the conductive portion of the wiring layer. The dielectric 142 of the capacitance 140 and the dielectric 162 of the capacitance 160 are one example of the insulating portion of the wiring layer. In the wiring layer, for example, a layer in which the transmission line 130 and the transmission line 150 are formed is disposed over a layer in which the terminal 131, the terminal 141, the terminal 151, and the terminal 161 are formed, through a layer in which the dielectric 142 and the dielectric 162 are formed. For example, the terminal 131 and the terminal 151, and the transmission line 130 and the transmission line 150 are coupled through a via (here, illustrated as a part of the transmission line 130 and the transmission line 150) disposed between the layers in which the terminal 131 and the terminal 151, and the transmission line 130 and the transmission line 150 are formed. The terminal 131 and the terminal 151 may be disposed in the same layer as the layer in which the transmission line 130 and the transmission line 150 are formed.

The semiconductor device 100 having the above configuration may further be packaged as one or a plurality of semiconductor devices 100 or together with electronic components such as other semiconductor devices and capacitors, in which a rewiring layer that is embedded in a resin layer and has rewiring coupled to the semiconductor device 100 or the like over the resin layer is disposed. Such a package is known as a wafer level package (WLP) or a fan out wafer level package (FOWLP) in which the rewiring is extracted to a region greater than the area of the semiconductor device 100. This packaging is also called "modularization", and this packaged, for example, modularized, semiconductor device is also called a "semiconductor module" or a "module".

For example, after the semiconductor device 100 is formed, examination of whether or not the semiconductor device 100 appropriately operates is performed before the formed semiconductor device 100 is modularized as above. By selecting an appropriate product of the formed semiconductor device 100 by examination, mixing of an inappropriate product into a process subsequent to modularization and a decrease in yield caused by mixing are suppressed.

In examination of the semiconductor device 100 before modularization, for example, as illustrated in FIG. 1, an alternating current signal and a direct current voltage are input into the terminal 131 of the transmission line 130 coupled to an input side of the circuit element 120 (illustrated by a dotted line wide arrow in FIG. 1). For example, in the terminal 131 of the transmission line 130, a high-frequency (radio frequency (RF)) signal used for operating the circuit element 120 is input as the alternating current signal, and a direct current (DC) bias used for operating the circuit element 120 is input as the direct current voltage. The alternating current signal input from the terminal 131 together with the direct current voltage is transmitted to the circuit element 120 through the transmission line 130, and an output signal of the circuit element 120 obtained by operation corresponding to the input is output from the terminal 151 through the transmission line 150 coupled to an output side of the circuit element 120 (illustrated by a dotted line wide arrow in FIG. 1). In examination, the semiconductor device 100 in which a predetermined output signal is obtained from the circuit element 120 with respect to a predetermined input signal for the circuit element 120 is determined as an appropriate product.

At the time of examination of the semiconductor device 100, the terminal 131 of the transmission line 130 linked to the circuit element 120 on the input side and the terminal 151 of the transmission line 150 on the output side are used. The alternating current signal, which is the input signal, and the direct current voltage are input into the terminal 131 of the transmission line 130 on the input side at the same time, and the output signal of the circuit element 120 is output from the terminal 151 of the transmission line 150 on the output side. Accordingly, the number of terminals used in examination is reduced to a small number. The structure of the probe used in examination and a step of bringing the probe into contact are simplified, and the efficiency of examination is achieved.

For example, the semiconductor device 100 determined as an appropriate product in examination is sent to a process (WLP process) subsequent to modularization such as the WLP or the FOWLP described above. In the semiconductor module such as the WLP obtained by modularization, the rewiring (not illustrated) that is linked to the terminal 131 of the transmission line 130, the terminal 141 of the capacitance 140, the terminal 151 of the transmission line 150, and the terminal 161 of the capacitance 160 of the semiconductor device 100 is disposed in the rewiring layer.

In the case of operating the semiconductor device 100 after modularization, for example, the WLP, the rewiring disposed in the rewiring layer is used. The direct current voltage is input into the terminal 131 of the transmission line 130 (illustrated by a solid line wide arrow in FIG. 1), and the alternating current signal is input into the terminal 141 of the capacitance 140 (illustrated by a solid line wide arrow in FIG. 1) from outside. The alternating current signal input into the terminal 141 is transmitted to the circuit element 120 through the capacitance 140 and the transmission line 130, and the output signal of the circuit element 120 obtained by operation corresponding to the input is output from the terminal 161 through the transmission line 150 and the capacitance 160 (illustrated by a solid line wide arrow in FIG. 1).

In the modularized semiconductor device 100, the input signal (alternating current signal) is input into the circuit element 120 through the capacitance 140, and the output signal (alternating current signal) is output from the circuit element 120 through the capacitance 160. Accordingly, a direct current component that may be transmitted inside or outside the circuit element 120 and act as a noise is cut.

In the semiconductor device 100 before modularization and after modularization, the transmission line 130 and the transmission line 150 are said to be a transmission line coupled to the circuit element 120 in a direct current manner, and the terminal 131 and the terminal 151 are said to be a terminal coupled to the circuit element 120 in a direct current manner. In the semiconductor device 100 before modularization and after modularization, the terminal 141 of the capacitance 140 and the terminal 161 of the capacitance 160 are said to be a terminal coupled to the circuit element 120 in an alternating current manner.

In the semiconductor device 100, the terminal 131 of the transmission line 130 and the terminal 151 of the transmission line 150 coupled to the circuit element 120 in a direct current manner are disposed for acquisition of the input of the alternating current signal and the direct current voltage at the time of examination and the output obtained by the input, achievement of the efficiency of examination, and the like. In the semiconductor device 100, the terminal 141 of the capacitance 140 and the terminal 161 of the capacitance 160 coupled to the circuit element 120 in an alternating current manner are also disposed for inputting and outputting the alternating current signal by suppressing transmission of the direct current component that may act as a noise at the time of operation after modularization.

In the semiconductor device 100, a plurality of types of terminals may be disposed. By disposing the terminals, the impedance of the transmission lines 130 and 150 may be changed from a set value due to a parasitic component occurring between a part of the terminals and a conductor (GND conductor) set to a ground (GND) electric potential. For example, in the semiconductor device 100 illustrated in FIG. 1, a layout in which the terminal 141 of the capacitance 140 is extracted to the side of the transmission line 130 and the terminal 161 of the capacitance 160 is extracted to the side of the transmission line 150 is set. However, in this layout, the impedance of the transmission lines 130 and 150 may be changed from the set value due to a parasitic component occurring between the terminals 141 and 161 and the GND conductor, and appropriate input and output may not be performed for the circuit element 120 and the semiconductor device 100 including the circuit element 120. This point will be described with reference to FIG. 2.

Figure 2:
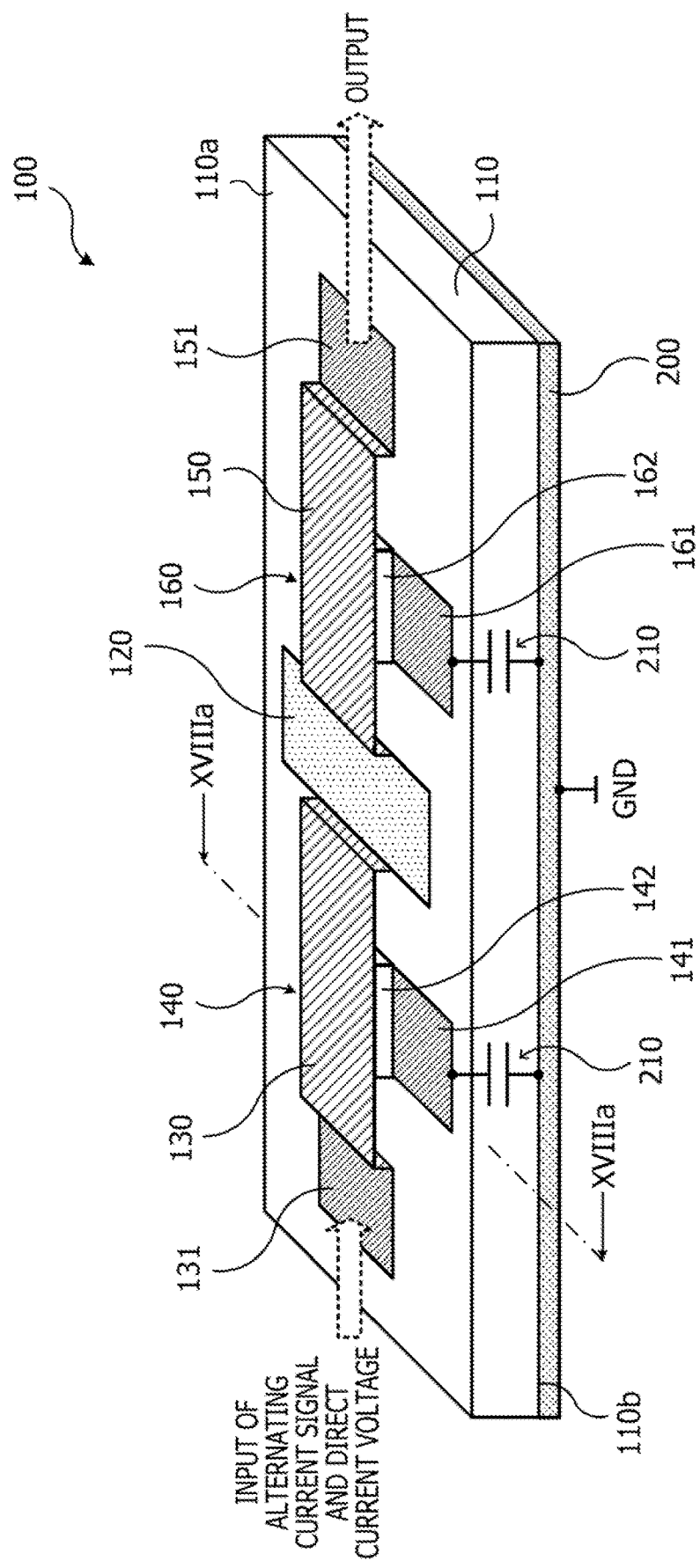
FIG. 2 is a diagram for describing one example of a situation that may occur in the semiconductor device.

FIG. 2 is a diagram for describing one example of a situation that may occur in the semiconductor device. In FIG. 2, a main perspective view of one example of the semiconductor device is schematically illustrated. In FIG. 2, one example of input and output at the time of examination of the semiconductor device is schematically illustrated together.

As described above, at the time of examination of the semiconductor device 100, for example, the alternating current signal, which is the input signal, and the direct current voltage are input into the terminal 131 of the transmission line 130 coupled to the circuit element 120 in a direct current manner (illustrated by a dotted line wide arrow in FIG. 2). The output signal of the circuit element 120 is output from the terminal 151 of the transmission line 150 coupled to the circuit element 120 in a direct current manner (illustrated by a dotted line wide arrow in FIG. 2).

In the semiconductor device 100, a GND plane layer set to the GND electric potential and a GND conductor 200 that is GND wiring may be disposed on a surface (inner surface) 110b side of the substrate 110 opposite to the outer surface 110a side on which the circuit element 120 and the like are disposed. In this case, a capacitive component corresponding to the sizes of the transmission line 130, the terminal 131, and the GND conductor 200 and the thickness and the like of the interposed substrate 110 occurs between the transmission line 130 and the terminal 131 extending to the circuit element 120 on the input side and the GND conductor 200. The impedance of the transmission line 130 extending from the terminal 131 to the circuit element 120 is adjusted to a predetermined value (set value) by considering the capacitive component occurring between the transmission line 130 and the GND conductor 200. For example, adjustment is performed by setting 50Ω as the set value for impedance matching with the circuit element 120 side. However, as illustrated in FIG. 2, in the transmission line 130, in a case where the capacitance 140 is disposed for inputting the alternating current signal and cutting the direct current component and the terminal 141 (part that protrudes from a position facing the transmission line 130 acting as the upper electrode) extracted to the side of the transmission line 130 from the conductive layer (part facing the transmission line 130 acting as the upper electrode) acting as the lower electrode is disposed, the following occurs.

For example, the above capacitive component occurs between the transmission line 130 extending from the terminal 131 to the circuit element 120 and the GND conductor 200. In the part of the capacitance 140, an electric signal of the transmission line 130 of the upper electrode is transmitted to the conductive layer of the lower electrode through the relatively thin dielectric 142 in a capacitive and alternating current manner. Thus, a capacitive component equivalent to the capacitive component between the transmission line 130 and the GND conductor 200 occurs between the conductive layer of the lower electrode and the GND conductor 200. Thus, in the transmission line 130 extending from the terminal 131 to the circuit element 120, even in a case where the conductive layer of the lower electrode of the capacitance 140 is disposed, a change in capacitive component between the transmission line 130 and the conductive layer of the lower electrode of the capacitance 140 and the GND conductor 200 is suppressed, and a change in impedance from the set value is suppressed. However, a parasitic component, for example, a parasitic capacitive component 210 illustrated in FIG. 2, occurs between the terminal 141 of the capacitance 140, which is linked to the conductive layer of the lower electrode to which the electric signal of the transmission line 130 of the upper electrode is transmitted in a capacitive and alternating current manner and is extracted to the side of the transmission line 130, and the GND conductor 200. In the transmission line 130 extending from the terminal 131 to the circuit element 120, the parasitic capacitive component 210 between the terminal 141 extracted from the conductive layer of the lower electrode and the GND conductor 200 is added to the capacitive component between the transmission line 130 and the conductive layer of the lower electrode and the GND conductor 200. In a case where the parasitic capacitive component 210 between the extracted terminal 141 and the GND conductor 200 is added, the impedance of the transmission line 130 extending from the terminal 131 to the circuit element 120 is changed from the set value. In a case where the impedance is changed from the set value, the input signal input into the terminal 131 is changed while being transmitted through the transmission line 130, and an input signal having an appropriate value may not be transmitted to the circuit element 120. For example, the input signal input into the terminal 131 may not be transmitted to the circuit element 120 as an appropriate value due to a change in proportion of an alternating current component flowing from the transmission line 130 to the GND conductor 200 coupled to the transmission line 130 in a capacitive manner or a change in phase of the transmitted signal.

Similarly, in the semiconductor device 100, the above capacitive component occurs between the transmission line 150 and the conductive layer of the lower electrode of the capacitance 160 and the GND conductor 200 in the transmission line 150 extending from the circuit element 120 to the terminal 151. A parasitic component, for example, the parasitic capacitive component 210 illustrated in FIG. 2, occurs between the terminal 161 of the capacitance 160, which is disposed in the transmission line 150, extracted to the side of the transmission line 150 from the conductive layer acting as the lower electrode and the GND conductor 200. Even in the transmission line 150 on the output side, such a parasitic component is added to the capacitive component occurring between the transmission line 150 and the conductive layer of the lower electrode of the capacitance 160 and the GND conductor 200 as described above with respect to the transmission line 130 on the input side. Accordingly, the impedance of the transmission line 150 extending from the circuit element 120 to the terminal 151 is changed from the set value, and the output signal output from the circuit element 120 is changed while being transmitted through the transmission line 150. An output signal having an appropriate value may not be acquired from the terminal 151.

In examination of the semiconductor device 100, the transmission line 130, the terminal 131, the transmission line 150, and the terminal 151 coupled to the circuit element 120 in a direct current manner are used. However, at the time of examination, appropriate signal transmission, for example, input and output, may not be performed due to the effect of the parasitic component caused by the terminal 141 and the terminal 161 which are coupled to the circuit element 120 in an alternating current manner and subsequently used at the time of operation. In a case where appropriate input and output are not performed at the time of examination, appropriate characteristic evaluation of the circuit element 120 may not be easily performed.

A similar situation may also occur at the time of operation of the modularized semiconductor device 100. For example, as described above, the alternating current signal is input into the terminal 141 of the capacitance 140 for the modularized semiconductor device 100. However, in a case where the impedance of the transmission line 130 extending from the part of the capacitance 140 (the conductive layer acting as the lower electrode, the dielectric 142, and the upper electrode) to the circuit element 120 is changed from the set value due to the effect of the parasitic component caused by the terminal 141 of the capacitance 140, an appropriate input signal may not be transmitted to the circuit element 120. In a case where the impedance of the transmission line 150 extending from the circuit element 120 to the part of the capacitance 160 (the conductive layer acting as the lower electrode, the dielectric 162, and the upper electrode) is changed from the set value due to the effect of the parasitic component caused by the terminal 161 of the capacitance 160, an appropriate output signal may not be acquired from the terminal 161. In the semiconductor device 100, even at the time of operation after examination, appropriate input and output may not be performed due to the effect of the parasitic component caused by the terminal 141 and the terminal 161 coupled to the circuit element 120 in an alternating current manner. In a case where appropriate input and output are not performed at the time of operation, appropriate operation of the circuit element 120 may not be easily performed.

In view of the above point, a semiconductor device capable of performing appropriate input and output by suppressing an effect of a parasitic component is implemented by employing the following configurations illustrated as embodiments.

[First Embodiment]

Figure 3:
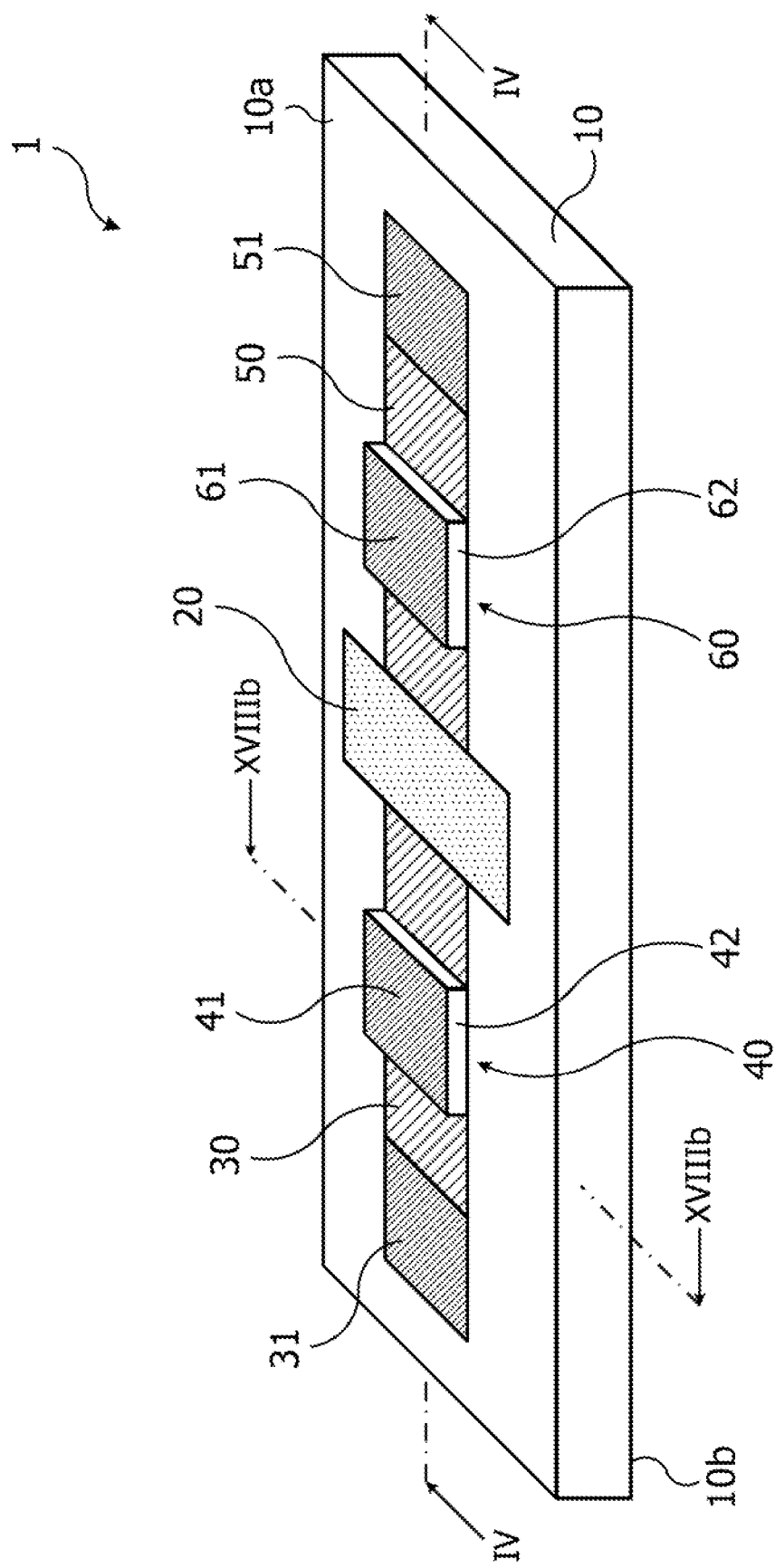
FIG. 3 is a diagram (part 1) for describing one example of a semiconductor device according to a first embodiment.
Figure 4:
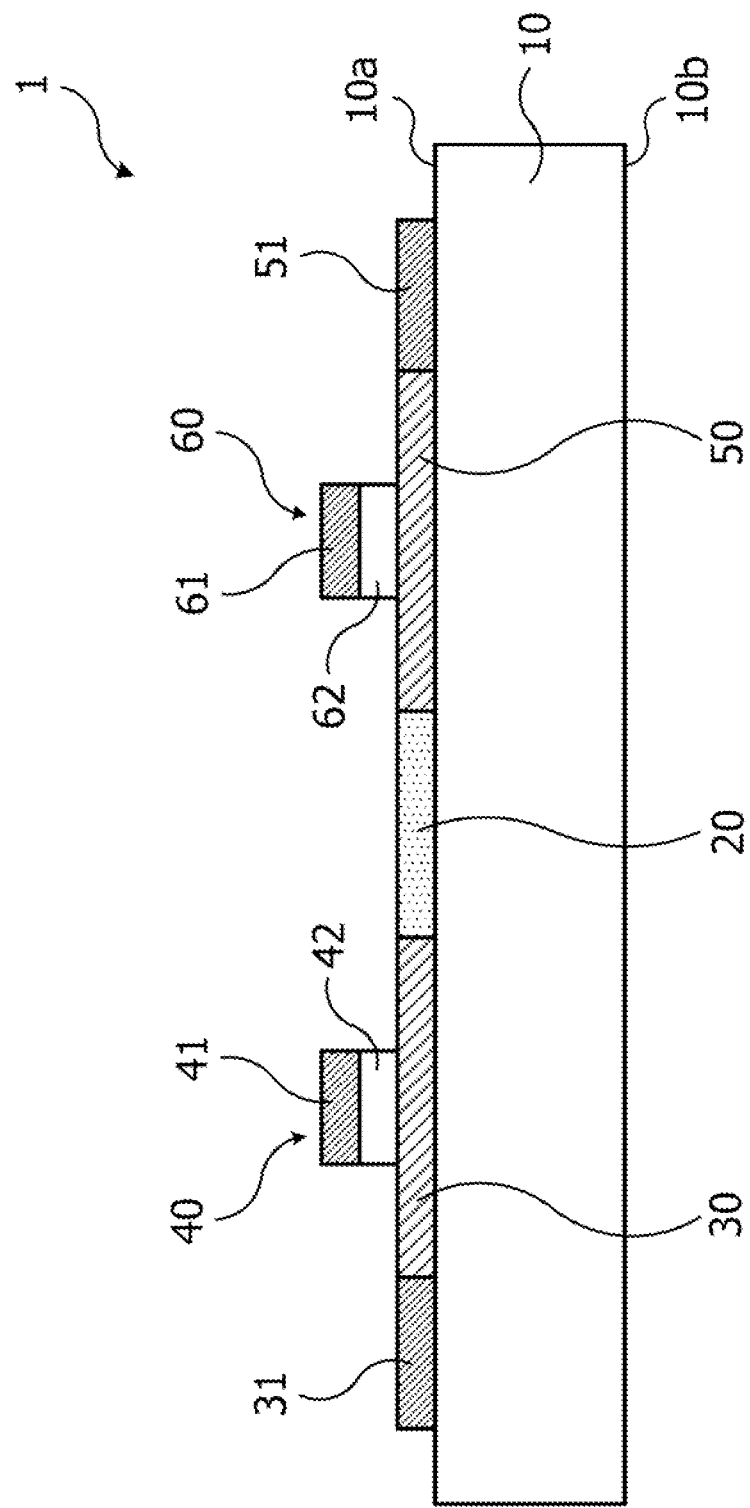
FIG. 4 is a diagram (part 2) for describing one example of the semiconductor device according to the first embodiment.

FIG. 3 and FIG. 4 are diagrams for describing one example of a semiconductor device according to a first embodiment. In FIG. 3, a main perspective view of one example of the semiconductor device is schematically illustrated. In FIG. 4, a IV-IV cross-sectional view of FIG. 3 is schematically illustrated.

A semiconductor device 1 illustrated in FIG. 3 and FIG. 4 includes a substrate 10 and a circuit element 20 disposed over the substrate 10. For example, the substrate 10 is a substrate in which various semiconductor materials such as Si, various compound semiconductor materials such as GaN, SiC, gallium arsenide (GaAs), and indium phosphide (InP), or an insulating material such as sapphire is used in the entirety or a part of the substrate. The circuit element 20 is a semiconductor element such as a transistor or an integrated circuit having a predetermined function such as amplification. For example, the circuit element 20 is formed on one surface (outer surface) 10a of the substrate 10.

Figure 5:
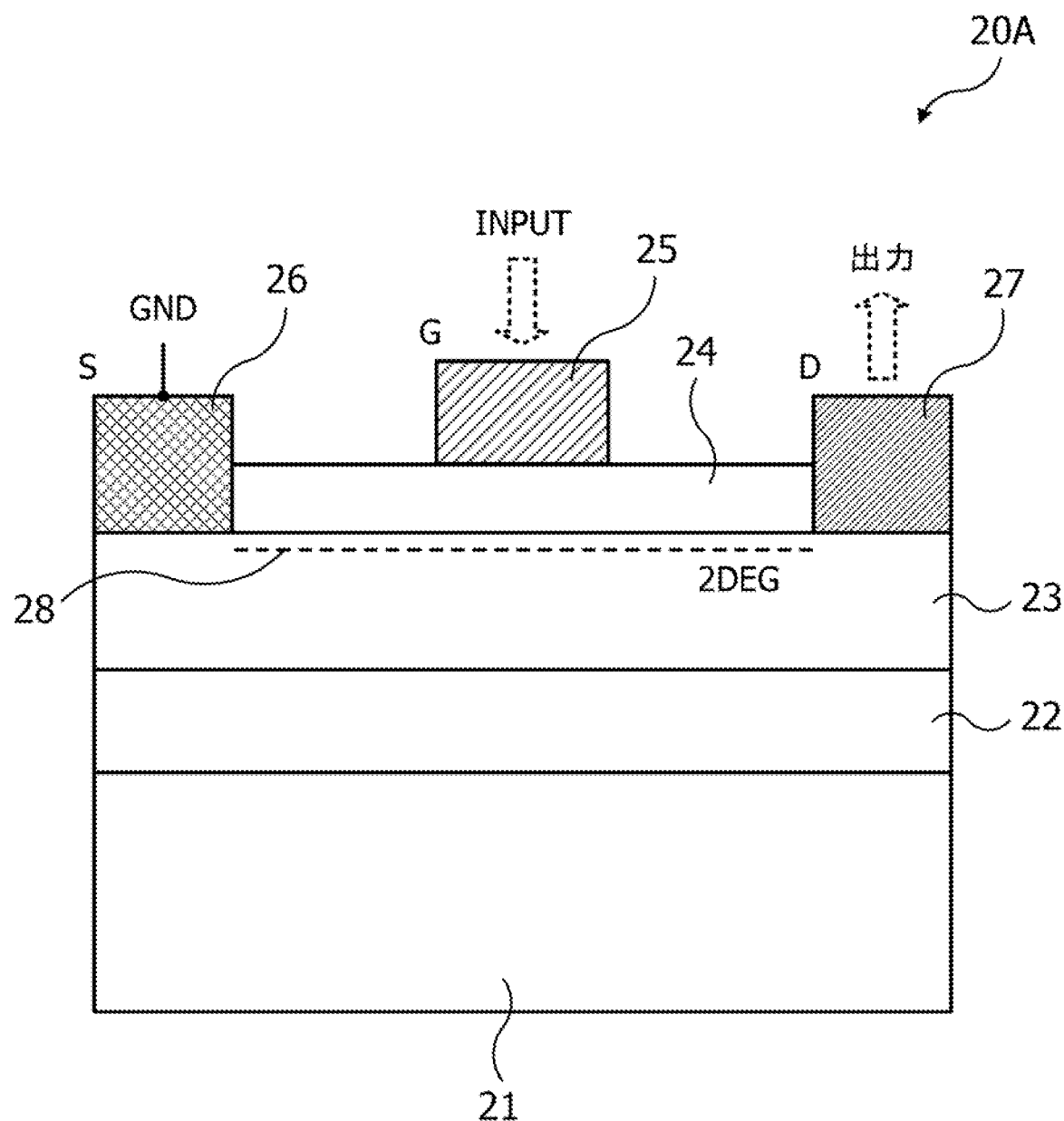
FIG. 5 is a diagram (part 1) illustrating a configuration example of a circuit element disposed in the semiconductor device according to the first embodiment.
Figure 6:
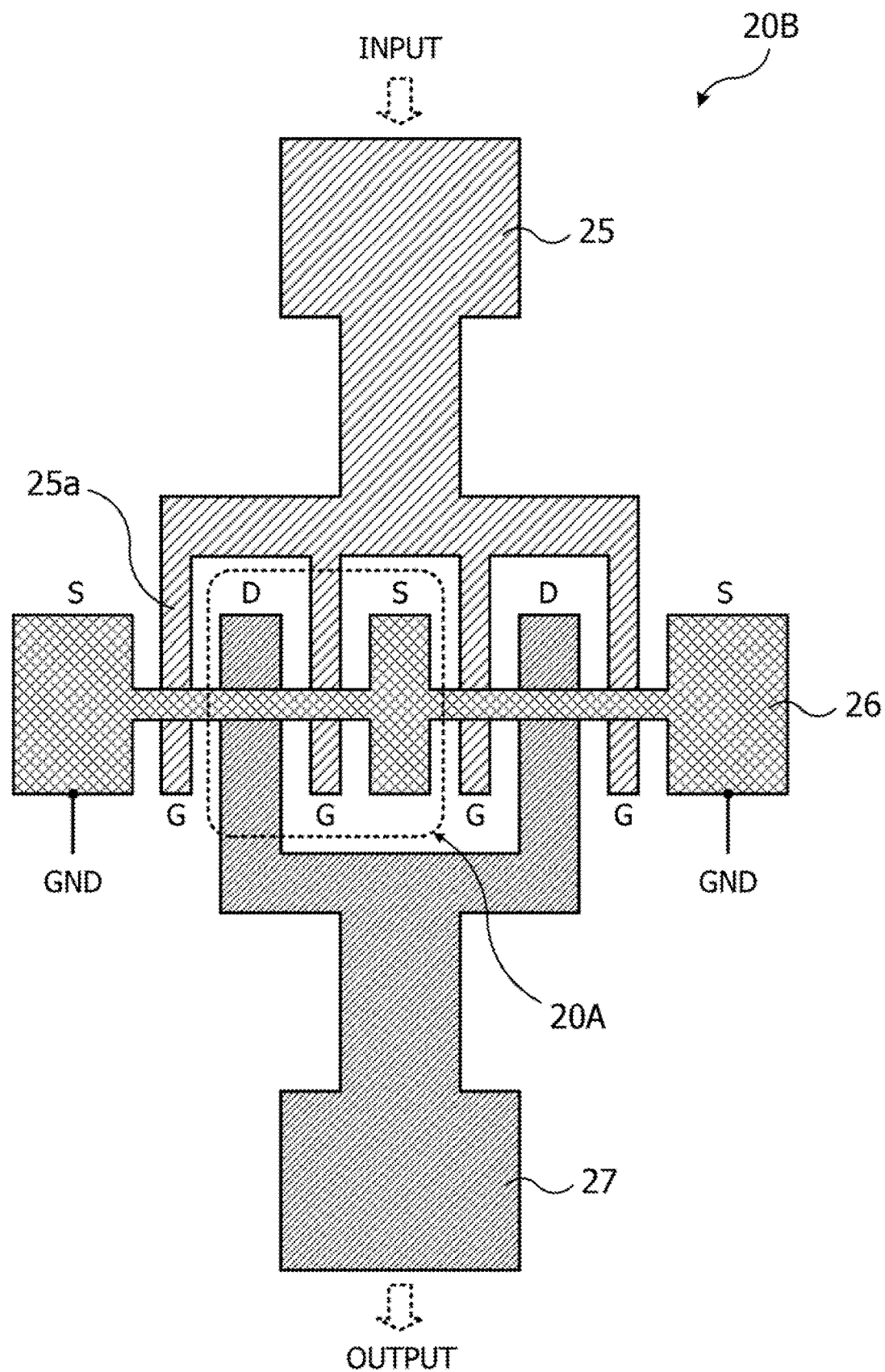
FIG. 6 is a diagram (part 2) illustrating the configuration example of the circuit element disposed in the semiconductor device according to the first embodiment.

A configuration example of the circuit element 20 will be described later (FIG. 5 and FIG. 6).

As illustrated in FIG. 3 and FIG. 4, the semiconductor device 1 further includes a transmission line 30 that is disposed over the substrate 10 and coupled to the circuit element 20. For example, one end of the transmission line 30 is coupled to an input terminal (gate terminal or the like of a transistor) of the circuit element 20. A terminal 31 is disposed at another end of the transmission line 30 of which one end is coupled to the circuit element 20. Capacitance 40 (capacitor) is disposed in the middle of the transmission line 30 linking the circuit element 20 to the terminal 31. The capacitance 40 includes a dielectric 42 disposed over a part of the transmission line 30 and a terminal 41 disposed over the dielectric 42. Various conductive materials, for example, metal materials such as Cu and Al, are used in the transmission line 30, the terminal 31, and the terminal 41 of the capacitance 40. Various dielectric materials, for example, dielectric materials such as SiO, SiN, and SiC, are used in the dielectric 42 of the capacitance 40. Besides, a high-dielectric material such as barium titanate (BaTiO$_3$; BTO), barium strontium titanate (Ba$_x$Sr$_{1-x}$TiO$_3$; BSTO) obtained by adding strontium (Sr) to BTO, strontium titanate (SrTiO$_3$; STO), lead zirconate titanate (Pb(Zr, Ti)O$_3$; PZT), or PZT (PLZT) to which lanthanum (La) is added may be used in the dielectric 42 of the capacitance 40.

For example, the capacitance 40 is MIM capacitance in which a part of the transmission line 30 is set as a lower electrode, the terminal 41 is set as an upper electrode, and the dielectric 42 is interposed between the upper electrode and the lower electrode. The terminal 41 acting as the upper electrode of the capacitance 40 is disposed in a width not protruding from the transmission line 30 acting as the lower electrode in a view from the outer surface 10a side of the substrate 10.

As illustrated in FIG. 3 and FIG. 4, the semiconductor device 1 further includes a transmission line 50 that is disposed over the substrate 10 and coupled to the circuit element 20. For example, one end of the transmission line 50 is coupled to an output terminal (drain terminal or the like of a transistor) of the circuit element 20. A terminal 51 is disposed at another end of the transmission line 50 of which one end is coupled to the circuit element 20. Capacitance 60 (capacitor) is disposed in the middle of the transmission line 50 linking the circuit element 20 to the terminal 51. The capacitance 60 includes a dielectric 62 disposed over a part of the transmission line 50 and a terminal 61 disposed over the dielectric 62. Various conductive materials, for example, metal materials such as Cu and Al, are used in the transmission line 50, the terminal 51, and the terminal 61 of the capacitance 60. Various dielectric materials, for example, dielectric materials such as SiO, SiN, and SiC, are used in the dielectric 62 of the capacitance 60. Besides, a high-dielectric material such as BTO, BSTO, STO, PZT, or PLZT may be used in the dielectric 62 of the capacitance 60.

For example, the capacitance 60 is MIM capacitance in which a part of the transmission line 50 is set as a lower electrode, the terminal 61 is set as an upper electrode, and the dielectric 62 is interposed between the upper electrode and the lower electrode. The terminal 61 acting as the upper electrode of the capacitance 60 is disposed in a width not protruding from the transmission line 50 acting as the lower electrode in a view from the outer surface 10a side of the substrate 10.

In the semiconductor device 1, a wiring layer having a conductive portion such as wiring, a via, and the like coupled to the circuit element 20 and an insulating portion covering the conductive portion is formed over the outer surface 10a of the substrate 10 in which the circuit element 20 is formed. The transmission line 30 and the terminal 31, the terminal 41 of the capacitance 40, the transmission line 50 and the terminal 51, and the terminal 61 of the capacitance 60 are one example of the conductive portion of the wiring layer. The dielectric 42 of the capacitance 40 and the dielectric 62 of the capacitance 60 are one example of the insulating portion of the wiring layer. In the wiring layer, for example, a layer in which terminal 41 and the terminal 61 are formed is disposed over a layer in which the transmission line 30, the terminal 31, the transmission line 50, and the terminal 51 are formed, through a layer in which the dielectric 42 and the dielectric 62 are formed. Besides, the terminal 31 and the terminal 51 may be disposed in the same layer as the layer in which the terminal 41 and the terminal 61 are formed. In this case, the terminal 31 and the terminal 51 formed in the layer are coupled to the transmission line 30 and the transmission line 50 formed in a lower layer of the layer through a via.

A configuration example of the transmission line 30, the capacitance 40, the transmission line 50, and the capacitance 60 will be described later (FIG. 7A to FIG. 11B).

A configuration example of the circuit element 20 disposed in the semiconductor device 1 will be described with reference to FIG. 5 and FIG. 6.

FIG. 5 and FIG. 6 are diagrams illustrating the configuration example of the circuit element disposed in the semiconductor device according to the first embodiment. In FIG. 5, a main cross-sectional view of one example of a transistor is schematically illustrated. In FIG. 6, a main plan view of one example of an integrated circuit is schematically illustrated.

In the semiconductor device 1, for example, a transistor 20A illustrated in FIG. 5 and an integrated circuit 20B illustrated in FIG. 6 are disposed as the circuit element 20.

In FIG. 5, a high electron mobility transistor (HEMT) is illustrated as one example of the transistor 20A. The transistor 20A includes a substrate 21, a buffer layer 22, a channel layer 23, a barrier layer 24, a gate electrode 25(G), a source electrode 26(S), and a drain electrode 27(D).

A substrate of SiC, GaN, sapphire, or the like is used in the substrate 21. The buffer layer 22 is disposed over the substrate 21. Aluminum nitride (AlN), aluminum gallium nitride ($Al_{1-x}Ga_xN$), or the like is used in the buffer layer 22. The channel layer 23 is disposed over the buffer layer 22. A nitride semiconductor material, for example, GaN, is used in the channel layer 23. The channel layer 23 is also called an electron transit layer. The barrier layer 24 is disposed over the channel layer 23. A different nitride semiconductor material from the channel layer 23, for example, AlGaN, is used in the barrier layer 24. The barrier layer 24 is also called an electron supply layer. In the transistor 20A, two-dimensional electron gas (2DEG) 28 is generated in the vicinity of an interface joined to the barrier layer 24 in the channel layer 23. A combination of nitride semiconductor materials generating the 2DEG 28 is used in the channel layer 23 and the barrier layer 24.

For example, a stack structure of the substrate 21, the buffer layer 22, the channel layer 23, and the barrier layer 24 is used as the substrate 10 or a part of the substrate 10.

The gate electrode 25 is disposed over the barrier layer 24. A metal material, for example, nickel (Ni) and gold (Au), is used in the gate electrode 25. A capping layer of GaN or the like and an insulating layer of oxide may be interposed between the gate electrode 25 and the barrier layer 24. The gate electrode 25 is disposed over the barrier layer 24 so as to function as a Schottky electrode. The source electrode 26 and the drain electrode 27 passes through the barrier layer 24 and are disposed over the channel layer 23. A metal material, for example, tantalum (Ta) and Al, is used in the source electrode 26 and the drain electrode 27. The source electrode 26 and the drain electrode 27 are disposed over the channel layer 23 so as to function as an ohmic electrode. The source electrode 26 and the drain electrode 27 may be disposed over the barrier layer 24 as long as the source electrode 26 and the drain electrode 27 function as the ohmic electrode.

In the transistor 20A having the above configuration, a high-frequency signal is input into the gate electrode 25 (illustrated by a dotted line wide arrow in FIG. 5). A current flowing between the source electrode 26 set to the GND electric potential and the drain electrode 27 set to a predetermined electric potential due to movement of an electron carrier of the 2DEG 28 accompanied by the input into the gate electrode 25 is acquired from the drain electrode 27 as an output (illustrated by a dotted line wide arrow in FIG. 5). For example, the transistor 20A is used for amplification.

In FIG. 6, a plurality of (in this example, four) transistors 20A illustrated in FIG. 5 are integrated and illustrated as one example of the integrated circuit 20B.

The integrated circuit 20B includes the gate electrode 25(G) having four gate fingers 25a branching in a comb teeth shape and has a configuration in which the source electrode 26(S) and the drain electrode 27(D) are alternately arranged with each gate finger 25a interposed between the source electrode 26(S) and the drain electrode 27(D). The drain electrodes 27 arranged at two locations are integrated into one, and the source electrodes 26 arranged at three locations are bridged by an upper layer to straddle the gate fingers 25a and the drain electrodes 27 arranged between the source electrodes 26. The gate electrode 25, the source electrodes 26, and the drain electrodes 27 are disposed over the stack structure (substrate 10 or a part of the substrate 10) of the substrate 21, the buffer layer 22, the channel layer 23, and the barrier layer 24 illustrated in FIG. 5. One gate finger 25a in the gate electrode 25 illustrated in FIG. 6 and a pair of the source electrode 26 and the drain electrode 27 arranged with the gate finger 25a interposed between the source electrode 26 and the drain electrode 27 correspond to the gate electrode 25, the source electrode 26, and the drain electrode 27 of the transistor 20A illustrated in FIG. 5. In the integrated circuit 20B, the function of the transistor 20A is implemented in the part of each gate finger 25a and the pair of the source electrode 26 and the drain electrode 27 between which the gate finger 25a is interposed. For example, the integrated circuit 20B is used in an amplification circuit having a function of amplification.

For example, a high-frequency signal is input into the gate electrode 25 of the integrated circuit 20B having the above configuration (illustrated by a dotted line wide arrow in FIG. 6). Accordingly, the current flowing between the source electrode 26 set to the GND electric potential and the drain electrode 27 set to the predetermined electric potential on both sides of each gate finger 25a of the gate electrode 25, is acquired from the drain electrode 27 as an output (illustrated by a dotted line wide arrow in FIG. 6).

While the transistor 20A (FIG. 5) which is one example of the HEMT and the integrated circuit 20B (FIG. 6) in which a plurality of transistors 20A are integrated are illustrated as the transistor and the integrated circuit used in the circuit element 20, the transistor and the integrated circuit used in the circuit element 20 are not limited to the transistor 20A and the integrated circuit 20B. In the circuit element 20, not only the transistor 20A described above but also various transistors such as a metal oxide semiconductor field effect transistor (MOSFET) may be used, or an integrated circuit in which various transistors are integrated may be used. In the integrated circuit used in the circuit element 20, not only the transistor but also various electronic elements such as a resistor, capacitance, and a coil may be integrated.

Next, a configuration example of the transmission line 30, the capacitance 40, the transmission line 50, and the capacitance 60 disposed in the semiconductor device 1 will be described with reference to FIG. 7A to FIG. 11B together with a method of forming the transmission line 30, the capacitance 40, the transmission line 50, and the capacitance 60.

Figure 7A:
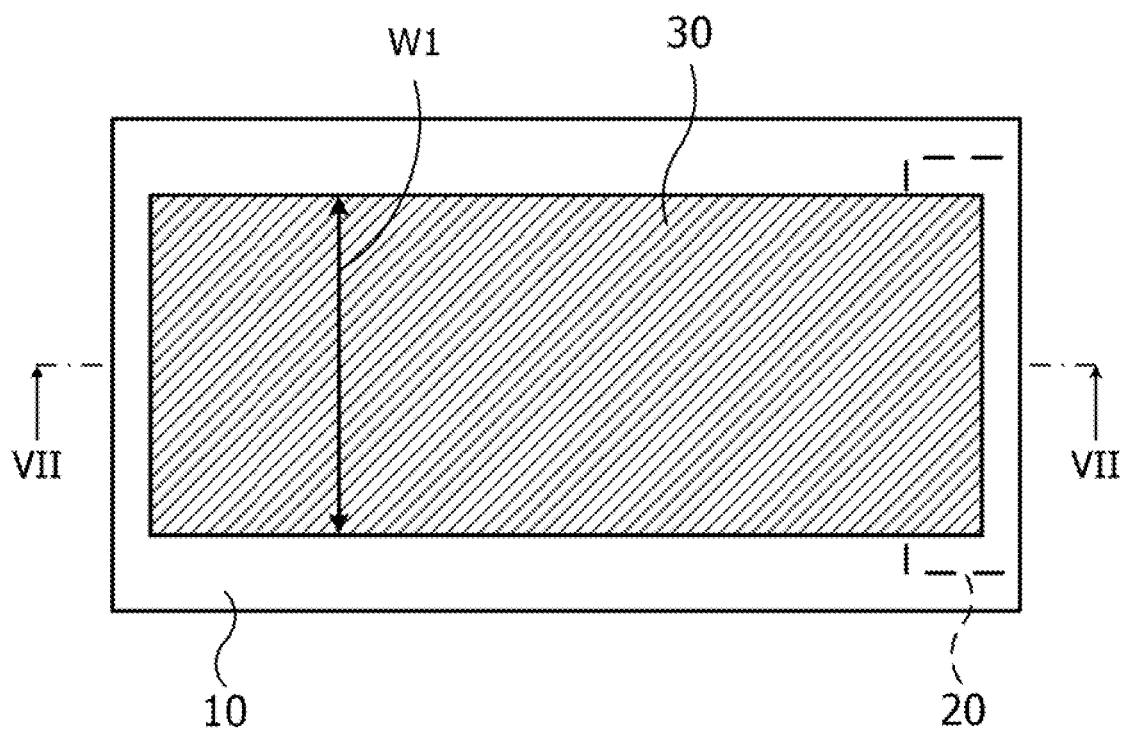
FIGS. 7A and 7B are diagrams (part 1) illustrating one example of a method of forming a transmission line and capacitance disposed in the semiconductor device according to the first embodiment.
Figure 8A:
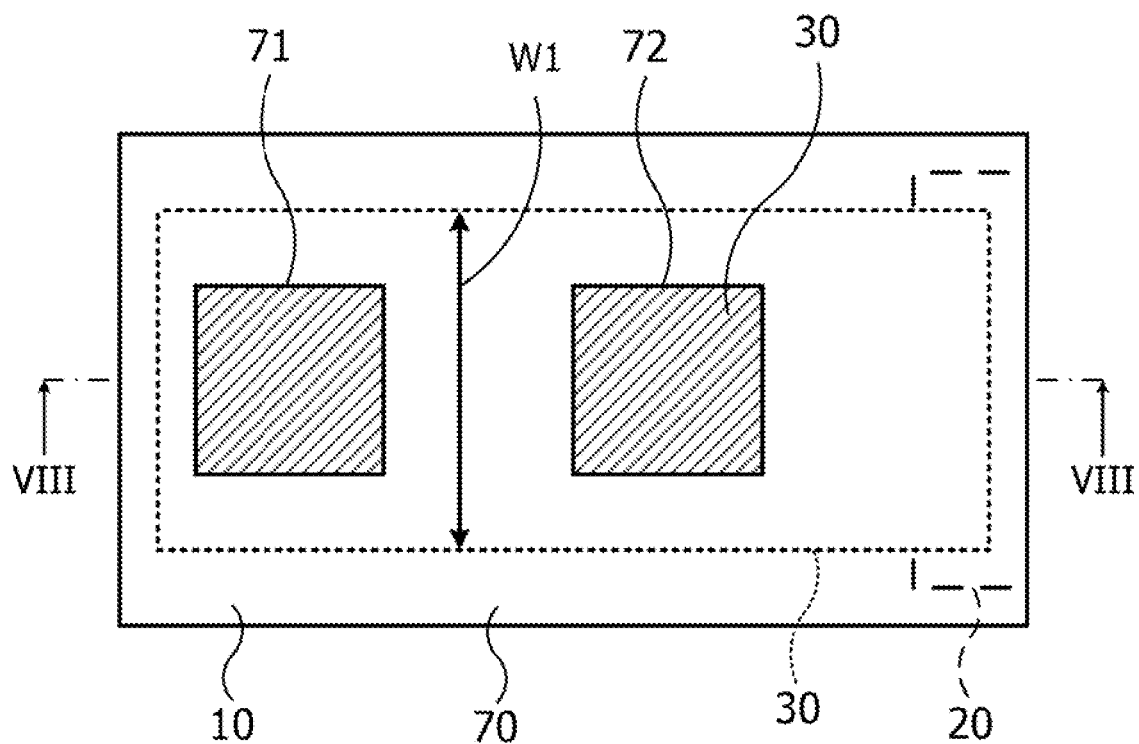
FIGS. 8A and 8B are diagrams (part 2) illustrating one example of the method of forming the transmission line and the capacitance disposed in the semiconductor device according to the first embodiment.
Figure 8B:
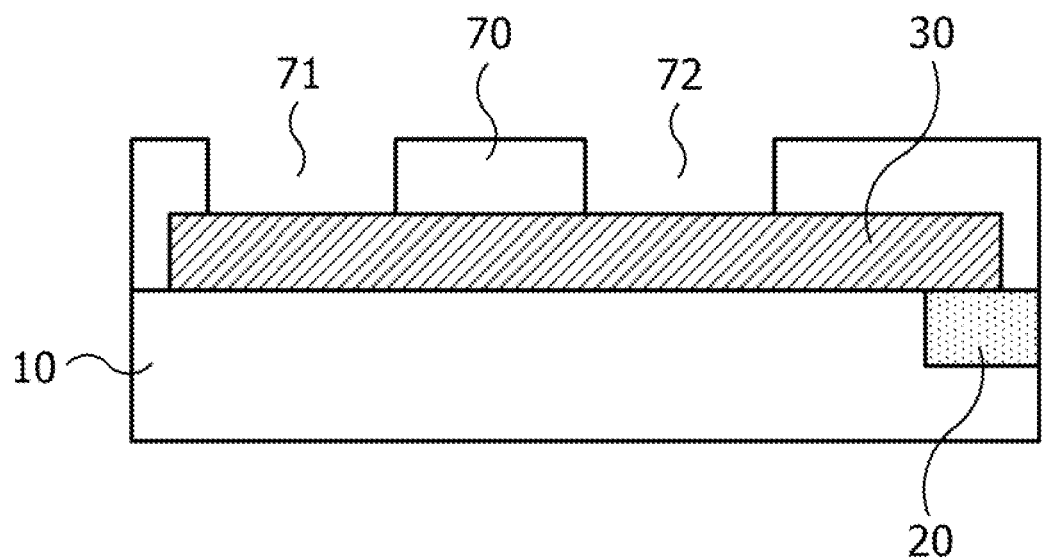
Figure 9A:
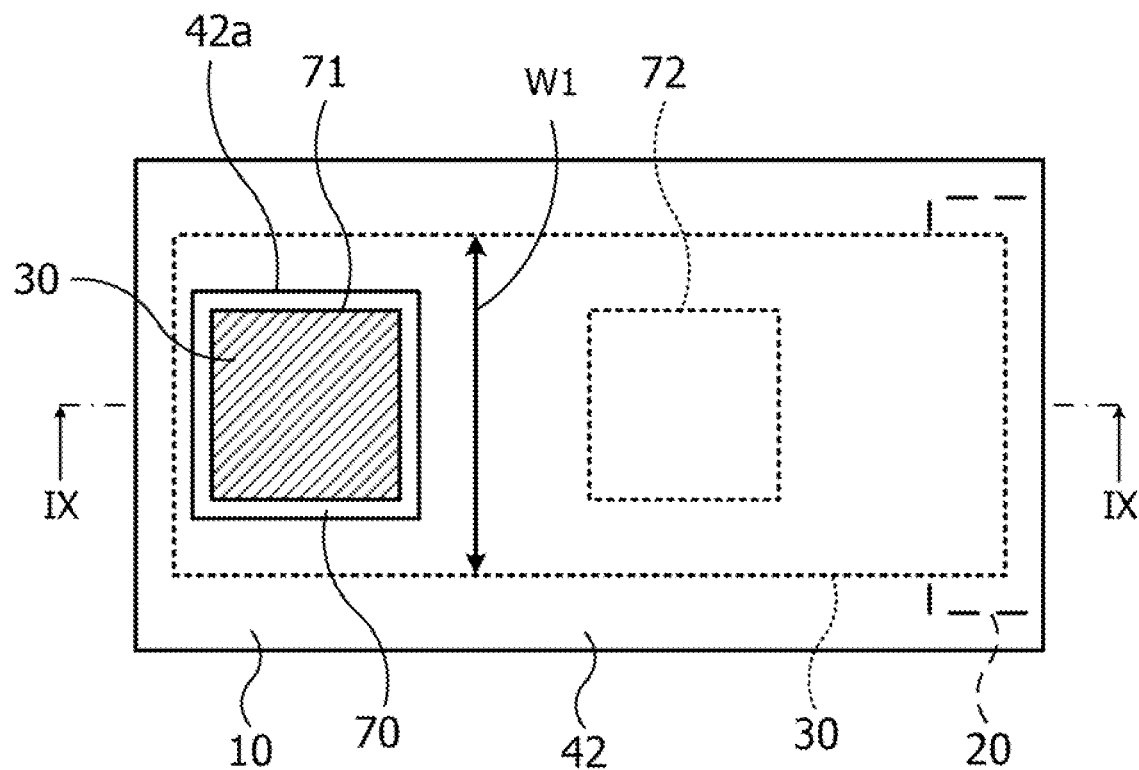
FIGS. 9A and 9B are diagrams (part 3) illustrating one example of the method of forming the transmission line and the capacitance disposed in the semiconductor device according to the first embodiment.
Figure 9B:
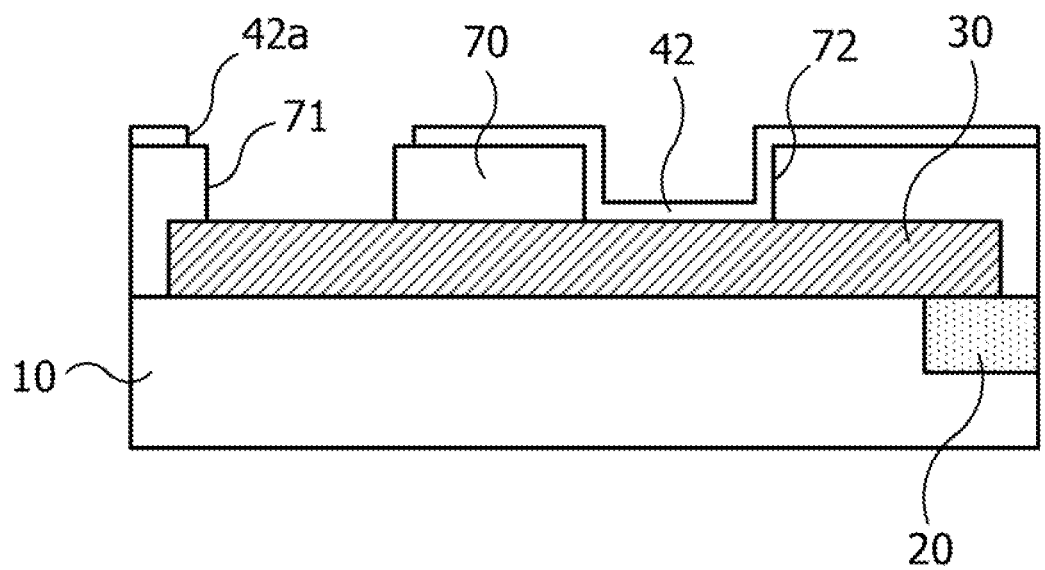
Figure 10A:
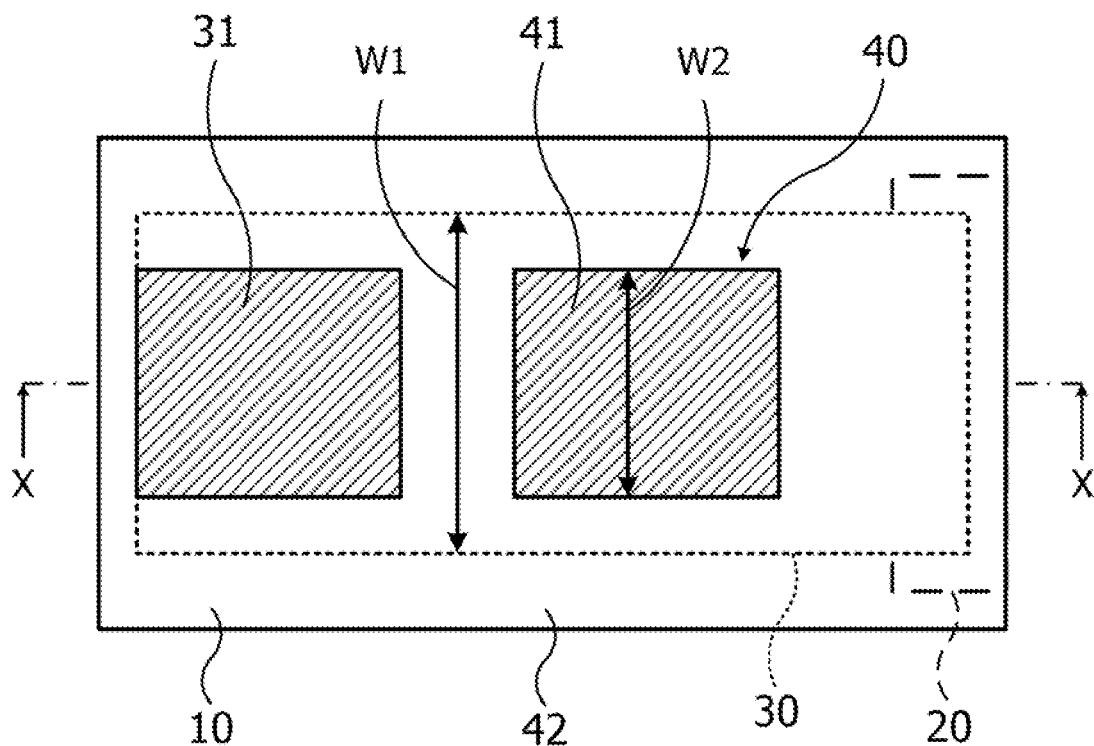
FIGS. 10A and 10B are diagrams (part 4) illustrating one example of the method of forming the transmission line and the capacitance disposed in the semiconductor device according to the first embodiment.
Figure 10B:
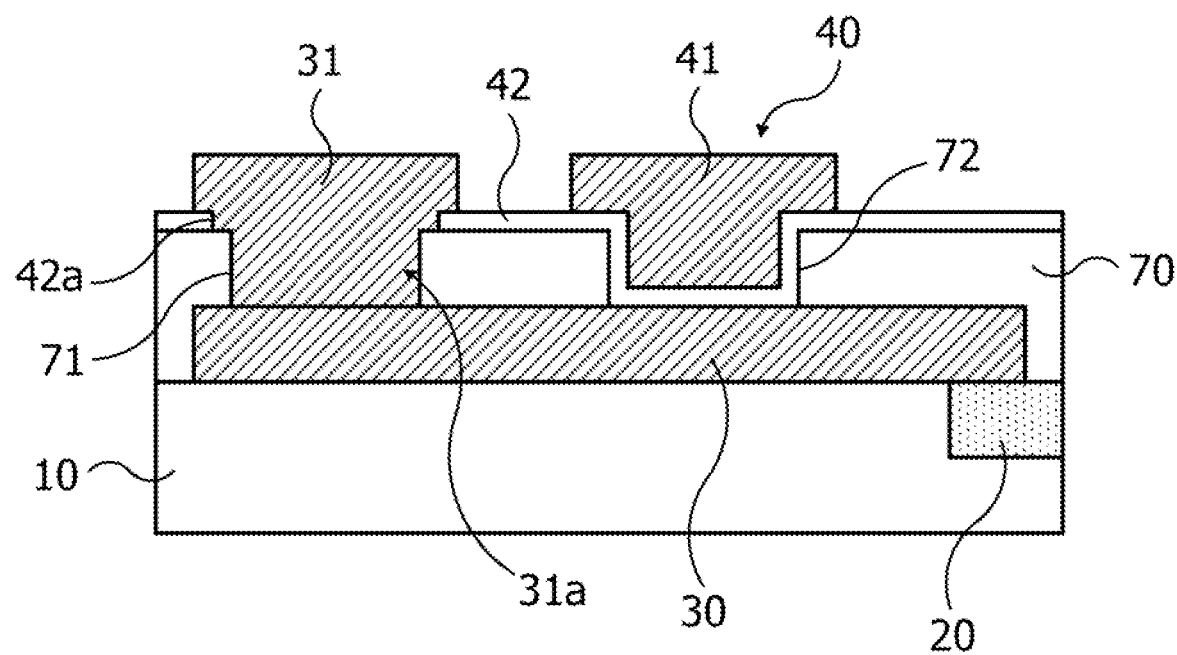

FIG. 7A to FIG. 10B are diagrams illustrating one example of a method of forming the transmission line and the capacitance disposed in the semiconductor device according to the first embodiment. In FIG. 7A, a main plan view of one example of a transmission line forming step is schematically illustrated. In FIG. 7B, a VII-VII cross-sectional view of FIG. 7A is schematically illustrated. In FIG. 8A, a main plan view of one example of an insulating portion forming step is schematically illustrated. In FIG. 8B, a VIII-VIII cross-sectional view of FIG. 8A is schematically illustrated. In FIG. 9A, a main plan view of one example of a dielectric forming step is schematically illustrated. In FIG. 9B, a IX-IX cross-sectional view of FIG. 9A is schematically illustrated. In FIG. 10A, a main plan view of one example of a terminal forming step is schematically illustrated. In FIG. 10B, a X-X cross-sectional view of FIG. 10A is schematically illustrated.

The transmission line 30 and the capacitance 40 disposed on an input side of the circuit element 20 will be described as an example.

Figure 7B:
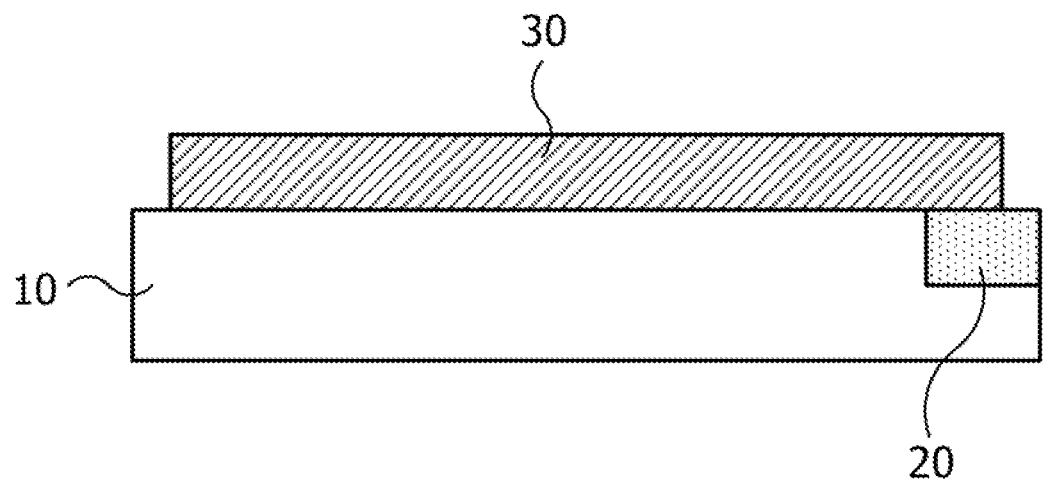

As illustrated in FIG. 7A and FIG. 7B, the transmission line 30 is formed in a predetermined width W1 over the substrate 10 in which the circuit element 20 is formed. The transmission line 30 is obtained by forming a conductive material such as Cu over the substrate 10 using photolithography technology and deposition technology such as a chemical vapor deposition (CVD) method, a sputtering method, or a plating method. The transmission line 30 is formed over the substrate 10 such that one end of the transmission line 30 is coupled to the input terminal of the circuit element 20, for example, the gate electrode 25 (FIG. 5 and FIG. 6) of the transistor 20A or the integrated circuit 20B described above.

Next, as illustrated in FIG. 8A and FIG. 8B, an insulating portion 70 is formed over the substrate 10 in which the transmission line 30 is formed. The insulating portion 70 is obtained by forming an insulating material such as SiO over the substrate 10 using deposition technology such as the CVD method or the sputtering method. In the insulating portion 70, an opening 71 and an opening 72 that lead to the transmission line 30 are formed in regions in which the terminal 31 of the transmission line 30 and the capacitance 40 are formed, using photolithography technology and etching technology. Of the opening 71 and the opening 72, at least the opening 72 disposed in a region in which the capacitance 40 is formed has a width (<width W1) that does not protrude from the transmission line 30 in a plan view.

Next, as illustrated in FIG. 9A and FIG. 9B, the dielectric 42 is formed over the insulating portion 70 in which the opening 71 and the opening 72 are formed. The dielectric 42 is obtained by forming a dielectric material such as SiO or BTO over the insulating portion 70 using deposition technology such as the CVD method or the sputtering method. In the dielectric 42, an opening 42a that leads to the transmission line 30 is formed in a region in which the terminal 31 of the transmission line 30 is formed, using photolithography technology and etching technology. The dielectric 42 is formed on the upper surface of the insulating portion 70 and the inner surface of the opening 72.

Next, as illustrated in FIG. 10A and FIG. 10B, the terminal 31 of the transmission line 30 and the terminal 41 of the capacitance 40 are formed over the insulating portion 70 in which the dielectric 42 is formed. The terminal 31 and the terminal 41 are obtained by forming a conductive material such as Cu over the substrate 10 using photolithography technology and deposition technology such as the CVD method, the sputtering method, or the plating method. The terminal 31 is disposed in the opening 71 of the insulating portion 70 and over the insulating portion 70 and is in contact with the transmission line 30. The terminal 31 includes a via 31a that links a part disposed over the insulating portion 70 to the transmission line 30 in a lower layer. The terminal 41 is disposed over the dielectric 42 disposed in the opening 72 of the insulating portion 70 and is not in contact with the transmission line 30. A width W2 (width of the largest part) of the terminal 41 is set to a width (<W1) that does not protrude from the transmission line 30 in a plan view.

For example, by using such a method, the transmission line 30 and the capacitance 40 illustrated in FIG. 10A and FIG. 10B are formed over the substrate 10. The transmission line 30 has a configuration in which one end is coupled to the circuit element 20 and the terminal 31 is disposed at another end. The capacitance 40 has a configuration in which a part of the transmission line 30 is set as a lower electrode, the terminal 41 disposed over the transmission line 30 through the dielectric 42 is set as an upper electrode, and the terminal 41 does not protrude from the transmission line 30 in a plan view. In the semiconductor device 1, for example, the transmission line 30 and the capacitance 40 having the configurations illustrated in FIG. 10A and FIG. 10B are disposed.

While the transmission line 30 and the capacitance 40 disposed on the input side of the circuit element 20 are described as an example, the transmission line 50 and the capacitance 60 disposed on an output side of the circuit element 20 may also be formed using the method illustrated in FIG. 7A to FIG. 10B. For example, the transmission line 50 is formed in the same step as the transmission line 30, and an insulating portion having openings in regions in which the terminal 51 and the capacitance 60 are formed is formed in the same step as the insulating portion 70. The dielectric 62 is formed in the same step as the dielectric 42, and the terminals 51 and 61 are formed in the same step as the terminals 31 and 41.

Figure 11A:
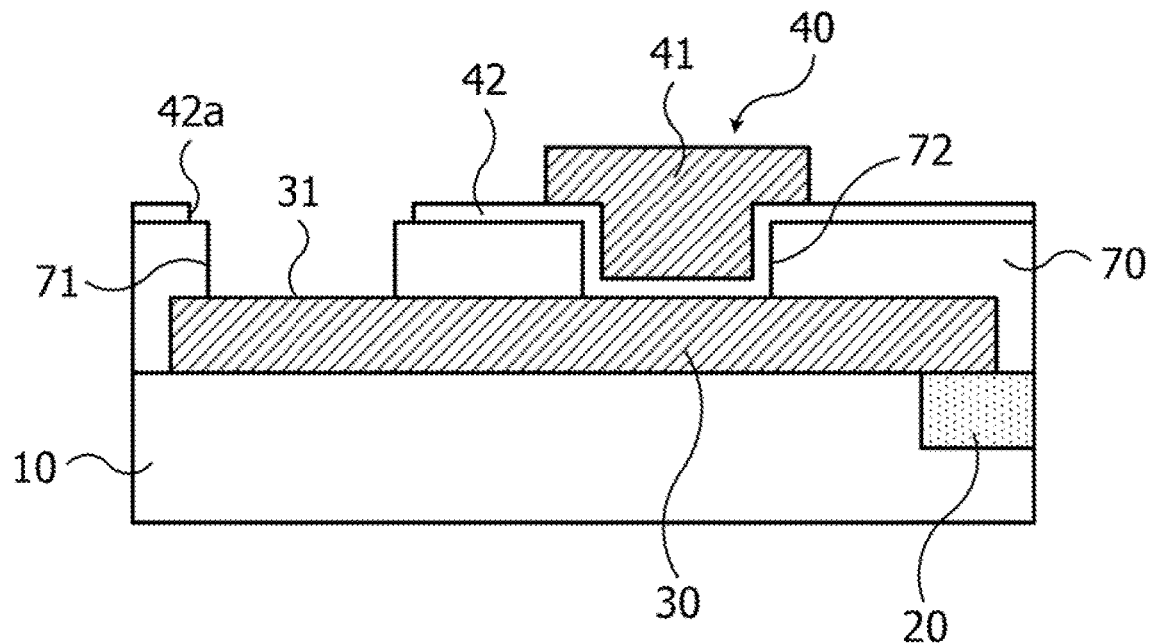
FIGS. 11A and 11B are diagrams illustrating another configuration example of the transmission line and the capacitance disposed in the semiconductor device according to the first embodiment.
Figure 11B:
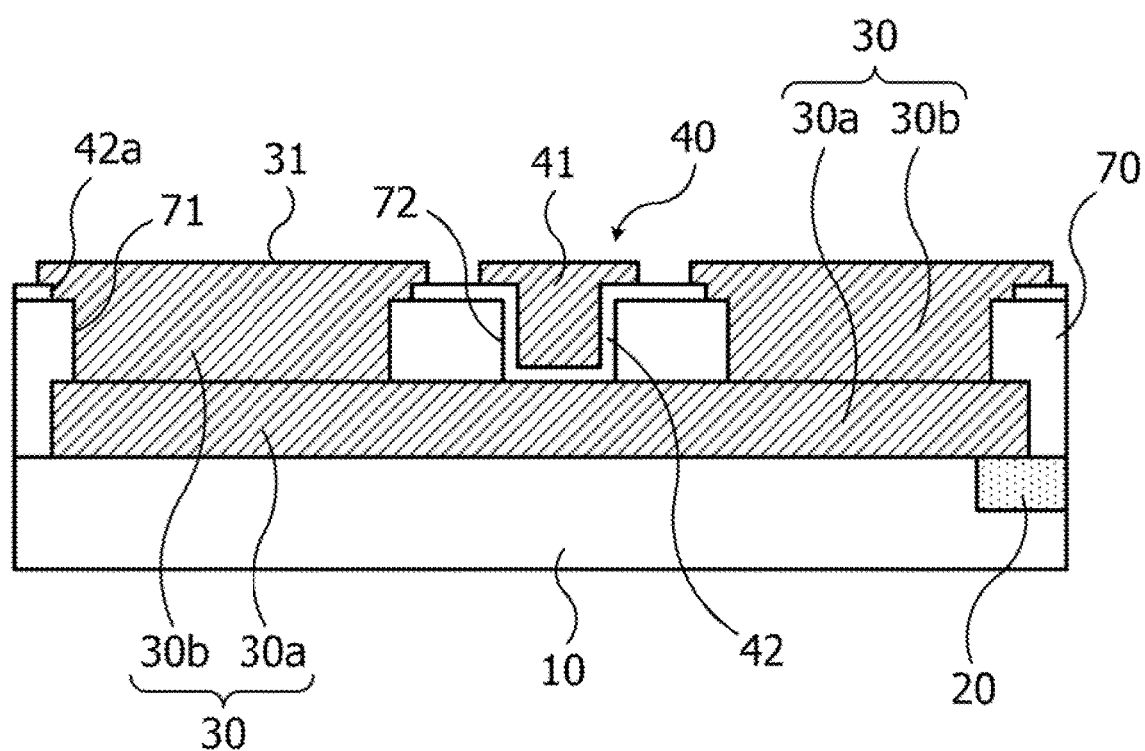

FIGS. 11A and 11B are diagrams illustrating another configuration example of the transmission line and the capacitance disposed in the semiconductor device according to the first embodiment. In each of FIG. 11A and FIG. 11B, a main cross-sectional view of one example of the semiconductor device is schematically illustrated.

The transmission line 30 and the capacitance 40 disposed on an input side of the circuit element 20 will be described as an example.

In the above example, the case of forming the terminal 31 over the transmission line 30 exposed from the opening 71 of the insulating portion 70 and the opening 42a of the dielectric 42 is described (FIGS. 9A and 9B and FIGS. 10A and 10B). Besides, as illustrated in FIG. 11A, the part of the transmission line 30 exposed from the opening 71 of the insulating portion 70 and the opening 42a of the dielectric 42 may be used as the terminal 31 without forming the terminal 31. In the semiconductor device 1, the transmission line 30 and the capacitance 40 having the configuration illustrated in FIG. 11A may be disposed.

In the above example, the case of forming the transmission line 30 having a single-layer structure is described (FIG. 7A to FIG. 10B). Besides, as illustrated in FIG. 11B, the transmission line 30 having a two-layer structure may be disposed by disposing a conductive layer 30b of an upper layer over a conductive layer 30a of a lower layer. In the case of forming the transmission line 30 having the two-layer structure, the conductive layer 30a of the lower layer is formed in accordance with the examples in FIG. 7A and FIG. 7B, and the insulating portion 70 having the opening 71 and the opening 72 is formed in accordance with the examples in FIG. 8A and FIG. 8B. At this point, the opening 71 is disposed to overlap with the conductive layer 30a of the lower layer except for a region in which the opening 72 for the capacitance 40 is formed. The dielectric 42 is formed in a region in which the capacitance 40 is formed in accordance with the examples in FIG. 9A and FIG. 9B, and a conductive material such as Cu is formed in accordance with the examples in FIG. 10A and FIG. 10B. The terminal 41 of the capacitance 40 is formed in the opening 72, and the conductive layer 30b of the upper layer is formed in the opening 71. Accordingly, the transmission line 30 having the two-layer structure of the conductive layer 30a of the lower layer and the conductive layer 30b of the upper layer is formed as illustrated in FIG. 11B. In the semiconductor device 1, the transmission line 30 and the capacitance 40 having the configuration illustrated in FIG. 11B may be disposed.

While the transmission line 30 and the capacitance 40 disposed on the input side of the circuit element 20 are described as an example, the transmission line 50 and the capacitance 60 disposed on the output side of the circuit element 20 may also be configured as illustrated in FIG. 11A or FIG. 11B.

The semiconductor device 1 that may have the above configuration will be further described.

Figure 12:
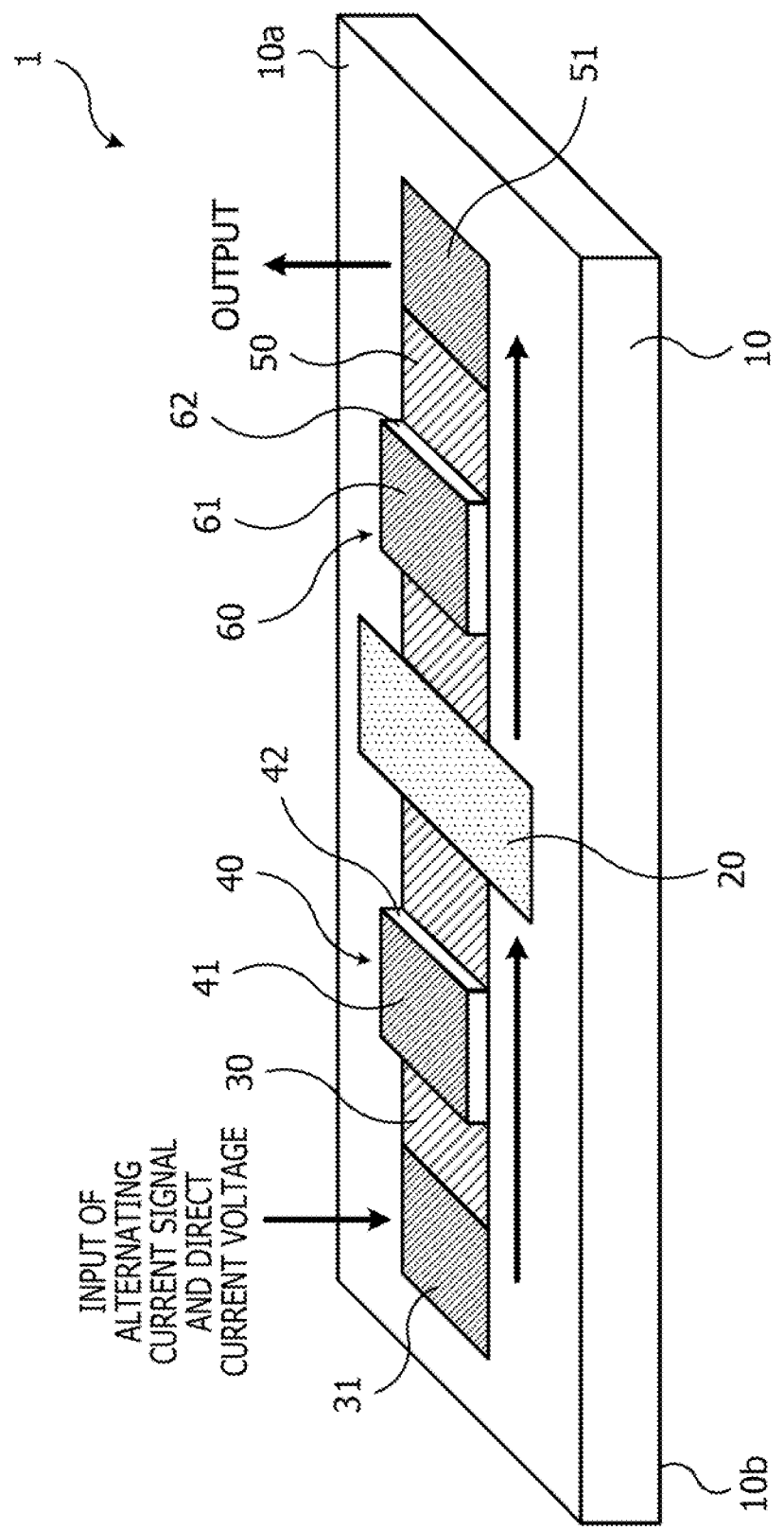
FIG. 12 is a diagram for describing examination of the semiconductor device according to the first embodiment.

FIG. 12 is a diagram for describing examination of the semiconductor device according to the first embodiment. In FIG. 12, a main perspective view of one example of the semiconductor device is schematically illustrated. In FIG. 12, one example of input and output at the time of examination of the semiconductor device is schematically illustrated together.

For example, examination of whether or not the semiconductor device 1 appropriately operates may be performed after the semiconductor device 1 is formed. By selecting an appropriate product of the formed semiconductor device 1 by examination, mixing of an inappropriate product into the subsequent process in the case of forming a package or a device using the semiconductor device 1 and a decrease in yield caused by mixing or shipment of an inappropriate product are suppressed.

In examination of the semiconductor device 1, for example, as illustrated in FIG. 12, an alternating current signal and a direct current voltage are input into the terminal 31 of the transmission line 30 coupled to the input side of the circuit element 20 (illustrated by a solid line arrow in FIG. 12). For example, in the terminal 31 of the transmission line 30, a high-frequency signal used for operating the circuit element 20 is input as the alternating current signal, and a DC bias used for operating the circuit element 20 is input as the direct current voltage. The alternating current signal input from the terminal 31 together with the direct current voltage is transmitted to the circuit element 20 through the transmission line 30 (illustrated by a solid line arrow in FIG. 12). The circuit element 20 performs a predetermined operation corresponding to the transmitted input signal. An output signal of the circuit element 20 obtained by operation is transmitted through the transmission line 50 coupled to the output side of the circuit element 20 (illustrated by a solid line arrow in FIG. 12) and is output from the terminal 51 (illustrated by a solid line arrow in FIG. 12). In examination, the semiconductor device 1 in which a predetermined output signal is obtained from the circuit element 20 with respect to a predetermined input signal for the circuit element 20 is determined as an appropriate product.

At the time of examination of the semiconductor device 1, the terminal 31 of the transmission line 30 linked to the circuit element 20 on the input side and the terminal 51 of the transmission line 50 on the output side are used. The alternating current signal and the direct current voltage are input into the terminal 31 of the transmission line 30 on the input side at the same time, and the output signal of the circuit element 20 is output from the terminal 51 of the transmission line 50 on the output side. Accordingly, the number of terminals used in examination is reduced to a small number. The structure of the probe used in examination and a step of bringing the probe into contact are simplified, and the efficiency of examination is achieved.

The semiconductor device 1 determined as an appropriate product in the above examination is shipped or sent to the subsequent process and is formed as a package or a device. A case where the semiconductor device 1 determined as an appropriate product in examination is sent to the subsequent process and is formed as a package will be described below as one example.

For example, the semiconductor device 1 is packaged as one or a plurality of semiconductor devices 1 or together with electronic components such as other semiconductor devices and capacitors, in which a rewiring layer that is embedded in a resin layer and has rewiring coupled to the semiconductor device 1 or the like over the resin layer is disposed. Such a package is known as the WLP or the FOWLP in which the rewiring is extracted to a region greater than the area of the semiconductor device 1. This packaging is also called "modularization", and this packaged, for example, modularized, semiconductor device is also called a "semiconductor module" or a "module".

Figure 13:
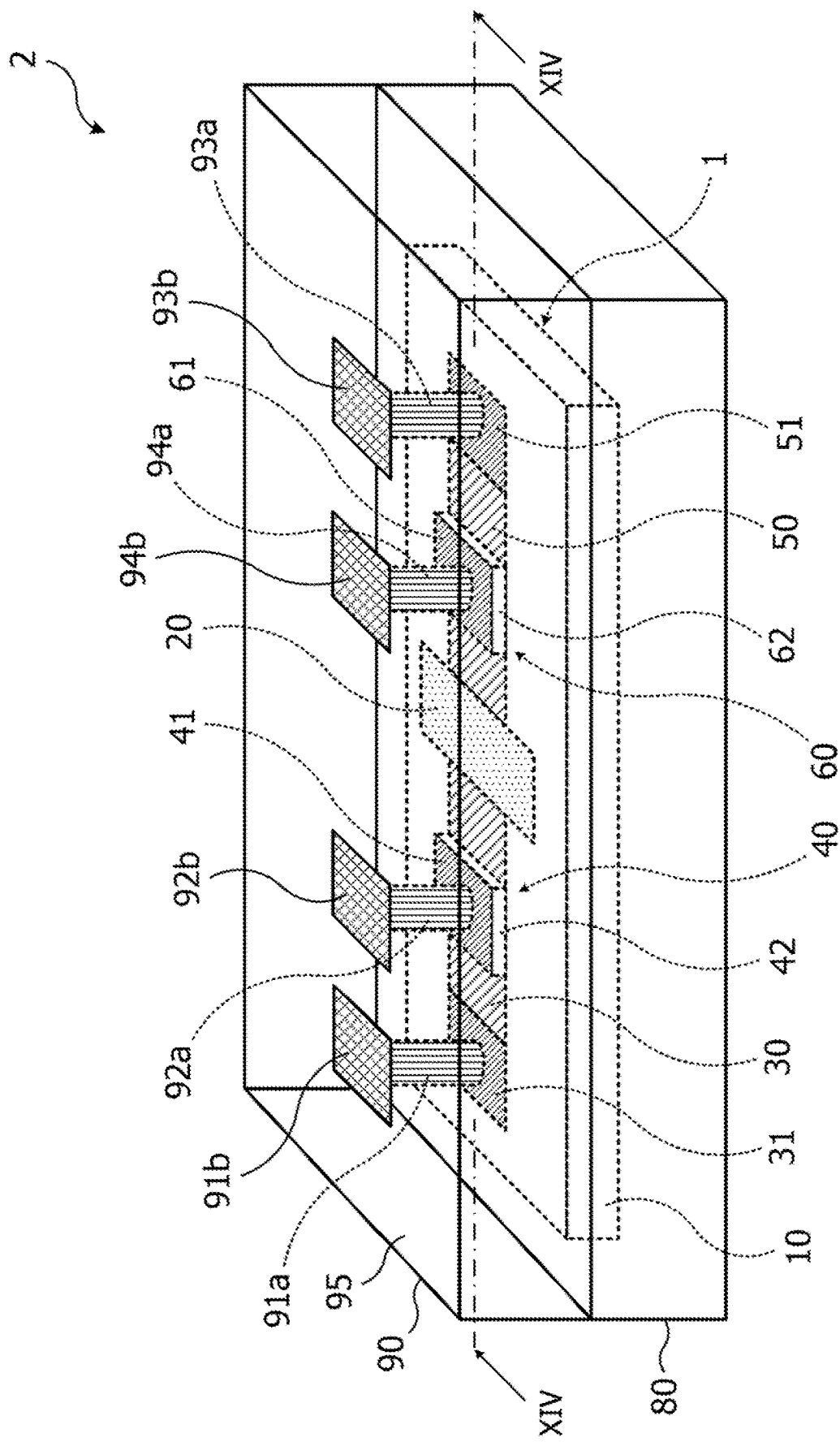
FIG. 13 is a diagram (part 1) for describing one example of a semiconductor module according to the first embodiment.
Figure 14:
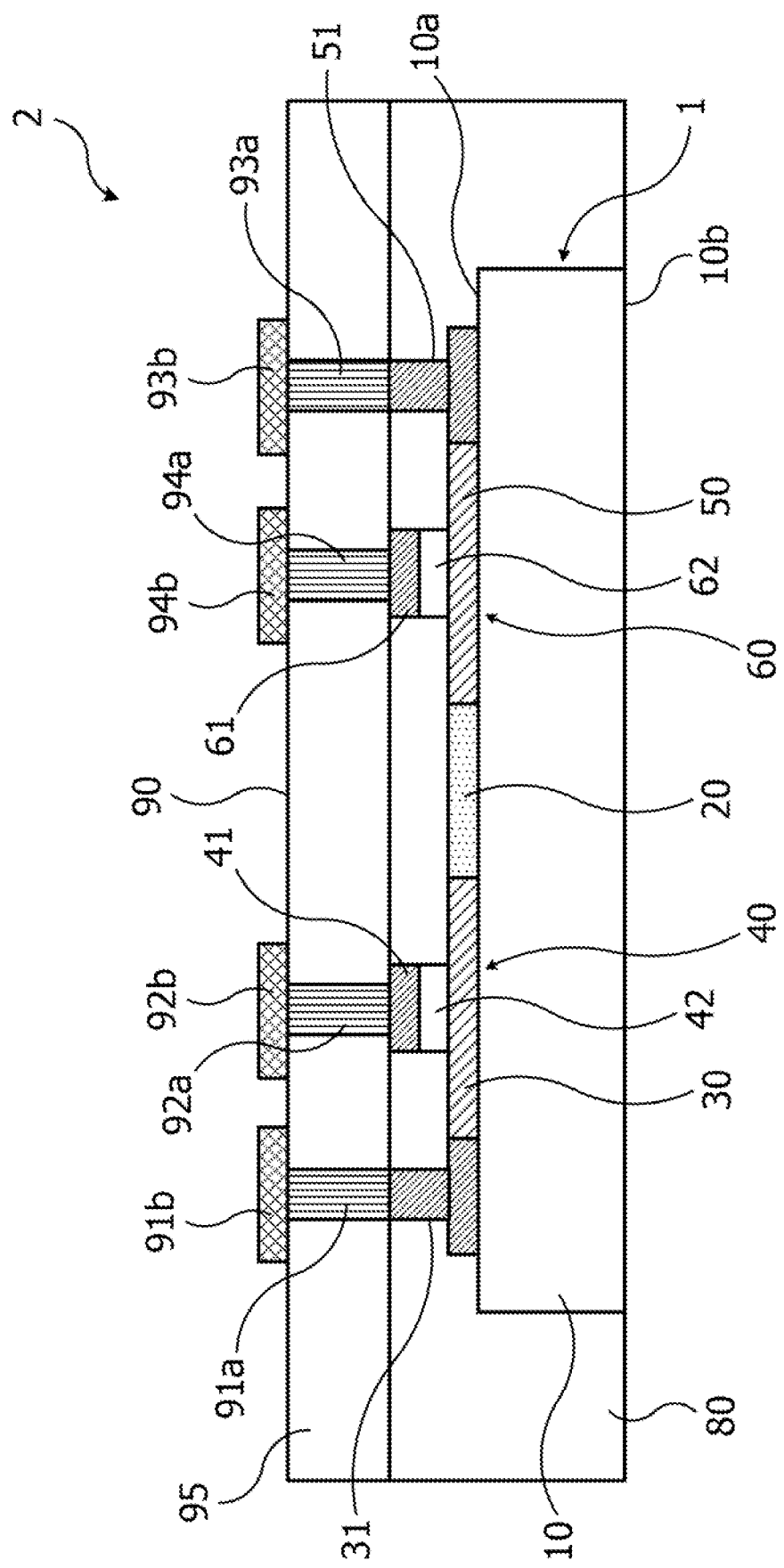
FIG. 14 is a diagram (part 2) for describing one example of the semiconductor module according to the first embodiment.

FIG. 13 and FIG. 14 are diagrams for describing one example of a semiconductor module according to the first embodiment. In FIG. 13, a main perspective view of one example of the semiconductor module is schematically illustrated. In FIG. 14, a XIV-XIV cross-sectional view of FIG. 13 is schematically illustrated.

A semiconductor module 2 illustrated in FIG. 13 and FIG. 14 includes the semiconductor device 1 having the configuration illustrated in FIG. 3 and FIG. 4, a resin layer 80 in which the semiconductor device 1 is embedded, and a rewiring layer 90 disposed over the semiconductor device 1 and the resin layer 80. While the semiconductor module 2 in which one semiconductor device 1 is embedded in the resin layer 80 is illustrated in FIG. 13 and FIG. 14, a plurality of semiconductor devices 1 may be embedded in the resin layer 80. Electronic components such as other semiconductor devices and capacitors may be embedded in the resin layer 80 together with one or a plurality of semiconductor devices 1. The semiconductor module 2 in which one semiconductor device 1 is embedded in the resin layer 80 will be described as an example.

Various resin materials, for example, an epoxy resin, a phenol resin, and a polyimide resin, are used in the resin layer 80. The resin material of the resin layer 80 may contain an insulating filler such as SiO.

The rewiring layer 90 includes a conductive portion (rewiring) such as wiring and a via coupled to the semiconductor device 1 embedded in the resin layer 80 and an insulating portion 95 covering the conductive portion. The rewiring layer 90 has a via 91a and wiring 91b coupled to the terminal 31 of the transmission line 30 and a via 92a and wiring 92b coupled to the terminal 41 of the capacitance 40 as the rewiring coupled to the semiconductor device 1. The rewiring layer 90 further has a via 93a and wiring 93b coupled to the terminal 51 of the transmission line 50 and a via 94a and wiring 94b coupled to the terminal 61 of the capacitance 60 as the rewiring coupled to the semiconductor device 1. Various conductive materials, for example, metal materials such as Cu and Al, are used in the vias 91a, 92a, 93a, 94a and the wiring 91b, 92b, 93b, and 94b. Various resin materials, for example, resin materials such as a polyimide resin, an epoxy resin, a phenol resin, and a polybenzoxazole resin, are used in the insulating portion 95 covering the rewiring.

The via 91a is disposed to extend upward from the upper surface of the terminal 31 of the transmission line 30, and the wiring 91b is disposed such that at least a part is exposed to the outside at the upper end of the via 91a. The via 92a is disposed to extend upward from the upper surface of the terminal 41 of the capacitance 40, and the wiring 92b is disposed such that at least a part is exposed to the outside at the upper end of the via 92a. The via 93a is disposed to extend upward from the upper surface of the terminal 51 of the transmission line 50, and the wiring 93b is disposed such that at least a part is exposed to the outside at an upper end of the via 93a. The via 94a is disposed to extend upward from the upper surface of the terminal 61 of the capacitance 60, and the wiring 94b is disposed such that at least a part is exposed to the outside at an upper end of the via 94a.

A multilayer structure in which a plurality of conductive layers are stacked upward may be used as long as the vias 91a, 92a, 93a, and 94a may couple the terminals 31, 41, 51, and 61 to the corresponding wiring 91b, 92b, 93b, and 94b. The shapes of the wiring 91b, 92b, 93b, and 94b are not limited to the illustrations in FIG. 13 and FIG. 14. For example, the wiring 91b and 93b may be extracted to a region greater than the area of the semiconductor device 1 (FOWLP).

FIGS. 15A to 15E are diagrams for describing one example of a method of forming the semiconductor module according to the first embodiment. In each of FIG. 15A to FIG. 15E, a main cross-sectional view of one example of a step of forming the semiconductor module is schematically illustrated.

For example, the semiconductor device 1 determined as an appropriate product in examination is modularized by a WLP process, and the semiconductor module 2 is formed.

Figure 15A:
FIGS. 15A to 15E are diagrams for describing one example of a method of forming the semiconductor module according to the first embodiment.

In the WLP process, as illustrated in FIG. 15A, one or a plurality of semiconductor devices 1, in this example, two semiconductor devices 1 in a cross-sectional view, are arranged over a predetermined support 300 such that the outer surface 10a side on which the circuit element 20 and the like are disposed is directed toward the support 300 side.

Figure 15B:
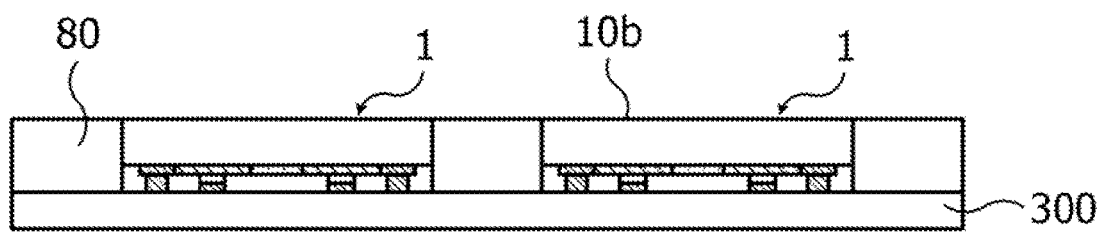

Next, as illustrated in FIG. 15B, the semiconductor device 1 over the support 300 is embedded in the resin layer 80 using a molding method. The semiconductor device 1 is embedded in the resin layer 80 in a state where the inner surface 10b is exposed as illustrated in FIG. 15B by sealing the entire semiconductor device 1 with the resin layer 80 using the molding method and then, backgrinding the resin layer 80 such that the surface (inner surface) 10b on the side opposite to the outer surface 10a on which the circuit element 20 and the like are disposed is exposed.

Figure 15C:
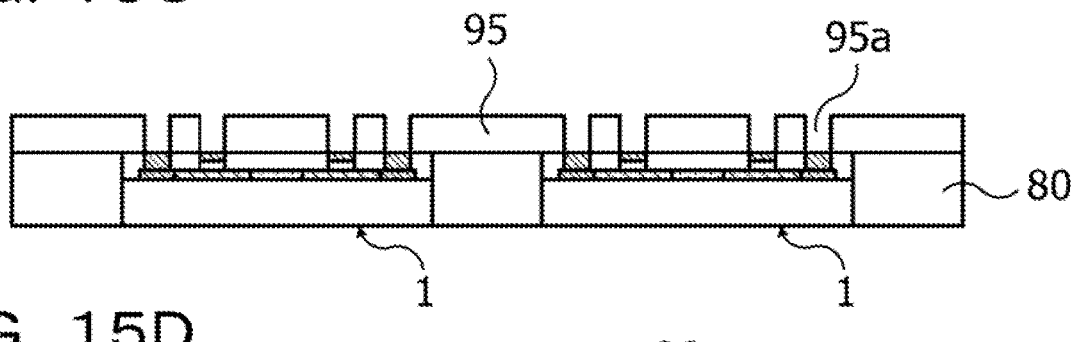

Next, as illustrated in FIG. 15C, the support 300 is separated from the resin layer 80 and the semiconductor device 1 embedded in the resin layer 80, and the insulating portion 95 of the rewiring layer 90 is formed over the surfaces of the resin layer 80 and the semiconductor device 1 from which the support 300 is separated. For example, a group of openings 95a leading to the terminals 31, 41, 51, and 61 of the semiconductor device 1 are formed by forming a photosensitive resin material over the resin layer 80 and the semiconductor device 1 using a coating method and performing patterning based on light exposure and development of the photosensitive resin material. Accordingly, the insulating portion 95 in which the group of openings 95a are disposed at predetermined locations is formed as illustrated in FIG. 15C.

Figure 15D:
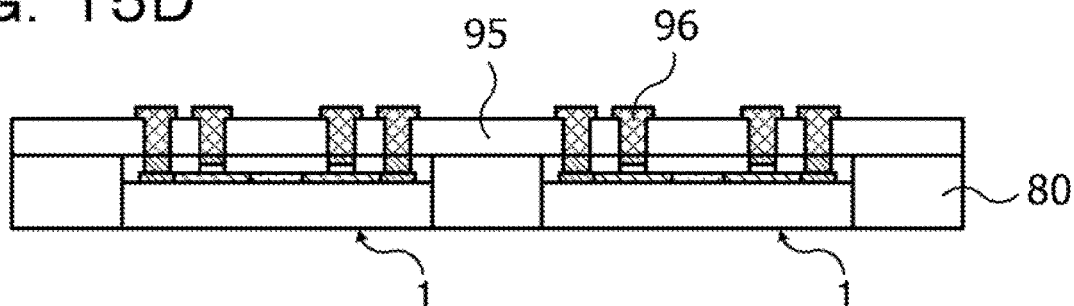

Next, as illustrated in FIG. 15D, rewiring 96 of the rewiring layer 90, for example, the via 91a and the wiring 91b, the via 92a and the wiring 92b, the via 93a and the wiring 93b, and the via 94a and the wiring 94b, is formed at the location of each of the group of openings 95a of the insulating portion 95. For example, the rewiring 96 is formed by forming a conductive material such as Cu using photolithography technology and deposition technology such as the CVD method, the sputtering method, or the plating method.

Figure 15E:
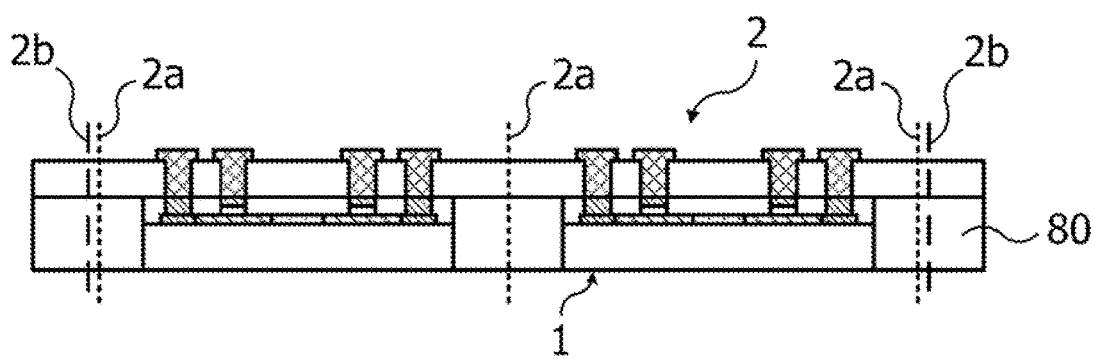

Then, for example, dicing is performed at positions 2a (in this example, three locations in a cross-sectional view) illustrated by dotted lines in FIG. 15E. Accordingly, each individual semiconductor module 2 in which one semiconductor device 1 is embedded in the resin layer 80 in a cross-sectional view and the rewiring layer 90 coupled to the semiconductor device 1 is disposed is formed.

For example, by using such a method, the semiconductor module 2 having the configuration illustrated in FIG. 13 and FIG. 14 is obtained.

For example, in a case where dicing is performed at positions 2b (in this example, two positions in a cross-sectional view) illustrated by chain lines in FIG. 15E, the semiconductor module 2 in which two semiconductor devices 1 are embedded in the resin layer 80 in a cross-sectional view and the rewiring layer 90 coupled to the semiconductor devices 1 is disposed may be obtained.

Figure 16:
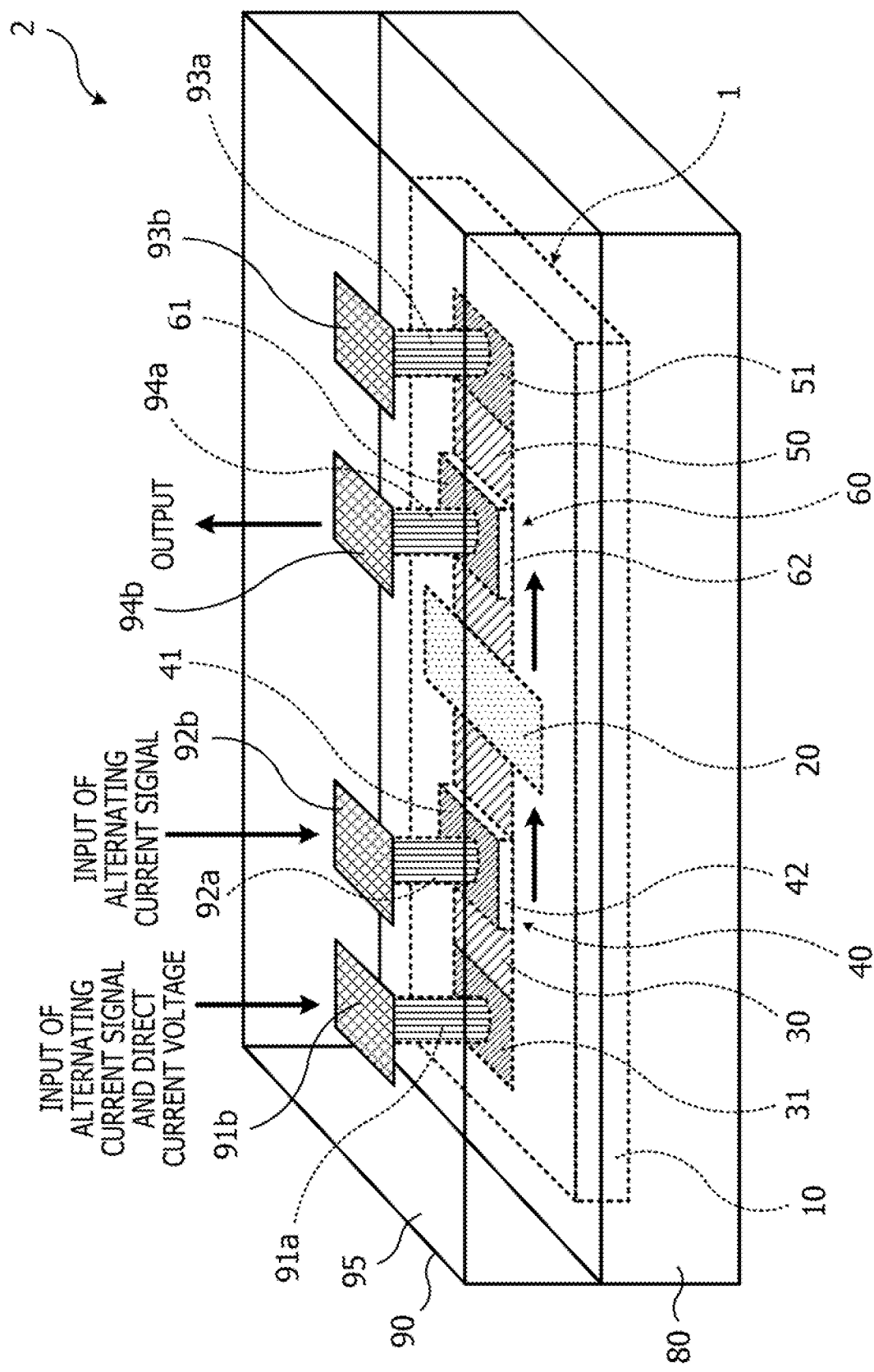
FIG. 16 is a diagram for describing operation of the semiconductor module according to the first embodiment.

FIG. 16 is a diagram for describing operation of the semiconductor module according to the first embodiment. In FIG. 16, a main perspective view of one example of the semiconductor module is schematically illustrated. In FIG. 16, one example of input and output at the time of operation of the semiconductor module is schematically illustrated together.

At the time of operation of the obtained semiconductor module 2, for example, as illustrated in FIG. 16, the direct current voltage is input into the terminal 31 of the transmission line 30 from the wiring 91b of the rewiring layer 90 through the via 91a (illustrated by a solid line arrow in FIG. 16). Furthermore, the alternating current signal is input into the terminal 41 of the capacitance 40 from the wiring 92b of the rewiring layer 90 through the via 92a (illustrated by a solid line arrow in FIG. 16). The alternating current signal input into the terminal 41 is transmitted through the capacitance 40 and the transmission line 30 in which the direct current voltage is input into the terminal 31, and is input into the circuit element 20 (illustrated by a solid line arrow in FIG. 16). The circuit element 20 performs a predetermined operation corresponding to the transmitted input signal. The output signal of the circuit element 20 obtained by operation is transmitted through the transmission line 50 (illustrated by a solid line arrow in FIG. 16) and is output from the wiring 94b through the capacitance 60, the terminal 61, and further the via 94a of the rewiring layer 90 (illustrated by a solid line arrow in FIG. 16).

In the semiconductor module 2, the input signal (alternating current signal) is input into the circuit element 20 through the capacitance 40, and the output signal (alternating current signal) is output from the circuit element 20 through the capacitance 60. Accordingly, a direct current component that may be transmitted inside or outside the circuit element 20 and act as a noise is cut, and the operation of the circuit element 20 and the semiconductor device 1 including the circuit element 20 and appropriate operation of the semiconductor module 2 including the semiconductor device 1 may be performed.

In the semiconductor device 1 and the semiconductor module 2 obtained by modularizing the semiconductor device 1, the transmission line 30 and the transmission line 50 are said to be a transmission line coupled to the circuit element 20 in a direct current manner, and the terminal 31 and the terminal 51 are said to be a terminal coupled to the circuit element 20 in a direct current manner. In the semiconductor device 1 and the semiconductor module 2 obtained by modularizing the semiconductor device 1, the terminal 41 of the capacitance 40 and the terminal 61 of the capacitance 60 are said to be a terminal coupled to the circuit element 20 in an alternating current manner.

Figure 17:
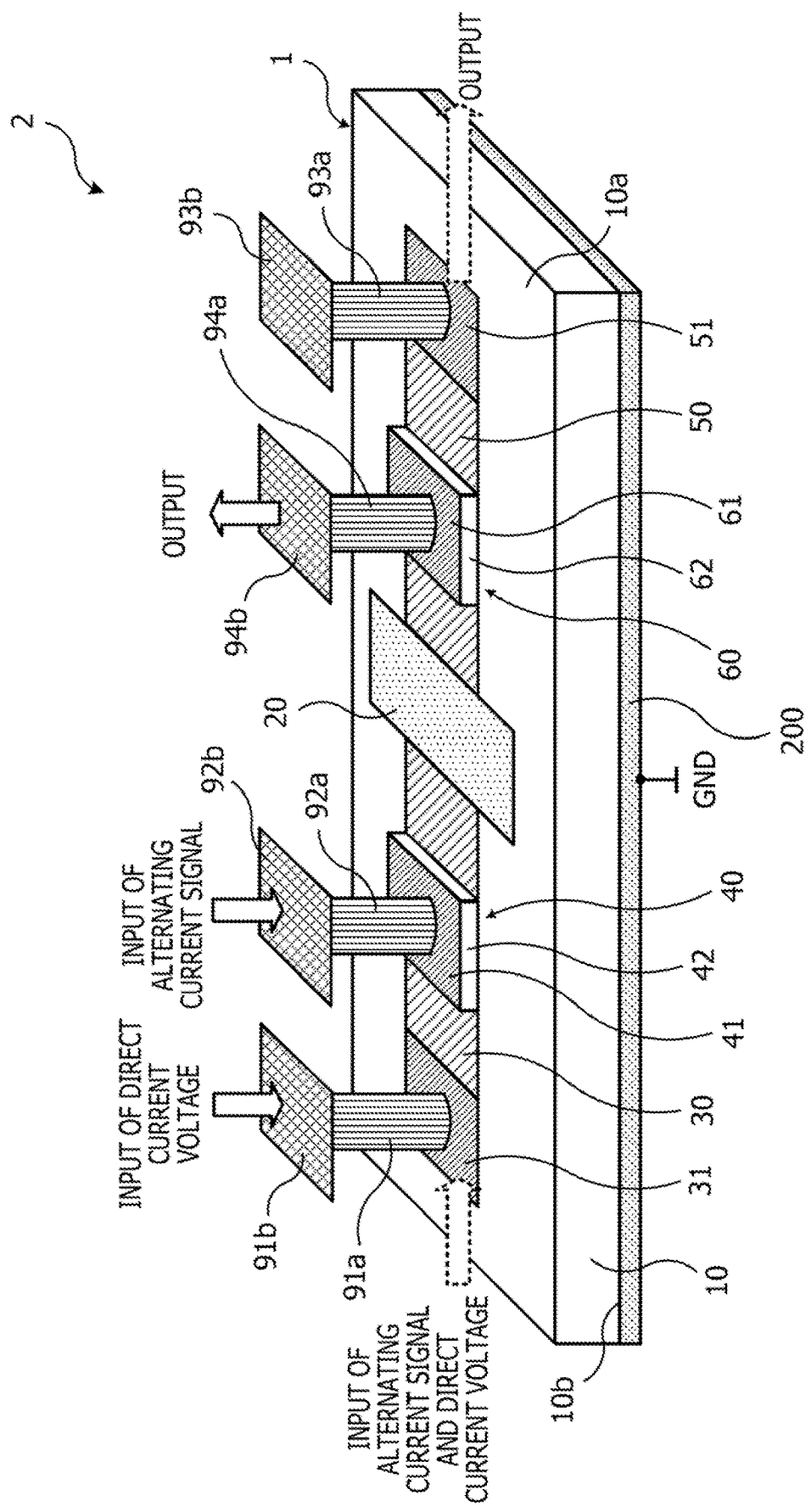
FIG. 17 is a diagram for describing input and output of the semiconductor device and the semiconductor module according to the first embodiment.

FIG. 17 is a diagram for describing input and output of the semiconductor device and the semiconductor module according to the first embodiment. In FIG. 17, a main perspective view of one example of the semiconductor module is schematically illustrated. In FIG. 17, the resin layer in which the semiconductor device is embedded and the insulating portion of the rewiring layer disposed over the resin layer are not illustrated for convenience. In FIG. 17, one example of input and output at the time of examination of the semiconductor device and operation of the semiconductor module is schematically illustrated together.

In the semiconductor device 1, the terminal 31 of the transmission line 30 and the terminal 51 of the transmission line 50 coupled to the circuit element 20 in a direct current manner are disposed for acquisition of the input of the alternating current signal and the direct current voltage at the time of examination and the output obtained by the input, achievement of the efficiency of examination, and the like. In the semiconductor device 1, the terminal 41 of the capacitance 40 and the terminal 61 of the capacitance 60 coupled to the circuit element 20 in an alternating current manner are also disposed for inputting and outputting the alternating current signal by suppressing transmission of the direct current component that may act as a noise at the time of operation after modularization.

As described above, at the time of examination of the semiconductor device 1 before modularization, the alternating current signal is input into the terminal 31 of the transmission line 30 coupled to the circuit element 20 in a direct current manner together with the direct current voltage (illustrated by a dotted line wide arrow in FIG. 17). The output of the circuit element 20 is output from the terminal 51 of the transmission line 50 coupled to the circuit element 20 in a direct current manner (illustrated by a dotted line wide arrow in FIG. 17). Accordingly, the number of terminals used in examination of the semiconductor device 1 is reduced to a small number. The structure of the probe and a step of bringing the probe into contact are simplified, and the efficiency of examination is achieved.

At the time of operation of the semiconductor module 2 obtained by modularizing the semiconductor device 1 after examination, the direct current voltage is input into the terminal 31 of the transmission line 30 of the semiconductor device 1 coupled to the circuit element 20 in a direct current manner from the wiring 91b through the via 91a (illustrated by a solid line wide arrow in FIG. 17). Furthermore, the alternating current signal is input into the terminal 41 of the capacitance 40 coupled to the circuit element 20 in an alternating current manner from the wiring 92b through the via 92a (illustrated by a solid line wide arrow in FIG. 17). The output of the circuit element 20 is transmitted to the wiring 94b through the capacitance 60 coupled to the circuit element 20 in an alternating current manner over the transmission line 50 and the via 94a from the terminal 61 and is output from the wiring 94b (illustrated by a solid line wide arrow in FIG. 17). Accordingly, the direct current component that may be transmitted inside or outside the circuit element 20 and act as a noise is cut, and the semiconductor module 2 (semiconductor device 1) is operated.

In the semiconductor device 1, two types of terminals including the terminal 31 coupled in a direct current manner and the terminal 41 coupled in an alternating current manner are disposed on the input side of the circuit element 20. Two types of terminals including the terminal 51 coupled in a direct current manner and the terminal 61 coupled in an alternating current manner are disposed on the output side of the circuit element 20.

In the semiconductor device 1 before modularization and after modularization, the capacitance 40 in which a part of the transmission line 30 is set as the lower electrode and the terminal 41 disposed over the lower electrode through the dielectric 42 is set as the upper electrode is disposed. The terminal 41 of the upper electrode has a width not protruding from the transmission line 30 of the lower electrode. Similarly, in the semiconductor device 1 before modularization and after modularization, the capacitance 60 in which a part of the transmission line 50 is set as the lower electrode and the terminal 61 disposed over the lower electrode through the dielectric 62 is set as the upper electrode is disposed. The terminal 61 of the upper electrode has a width not protruding from the transmission line 50 of the lower electrode.

In the semiconductor device 1 before modularization and after modularization, the GND conductor 200 may be disposed on the inner surface 10b side of the substrate 10 as illustrated in FIG. 17. For example, the conductor 200 including the GND plane layer and the GND wiring may be formed on the inner surface 10b of the substrate 10 of the semiconductor device 1.

In the semiconductor device 1 before modularization and after modularization, even in a case where the GND conductor 200 is disposed on the inner surface 10b side of the substrate 10, a parasitic component caused by the GND conductor 200 and a change in impedance caused by the parasitic component are suppressed by the capacitance 40 and the capacitance 60. This point will be described with reference to FIGS. 18A and 18B and FIGS. 19A and 19B below.

FIGS. 18A and 18B and FIGS. 19A and 19B are diagrams for describing the effect of suppressing the parasitic component.

Figure 18A:
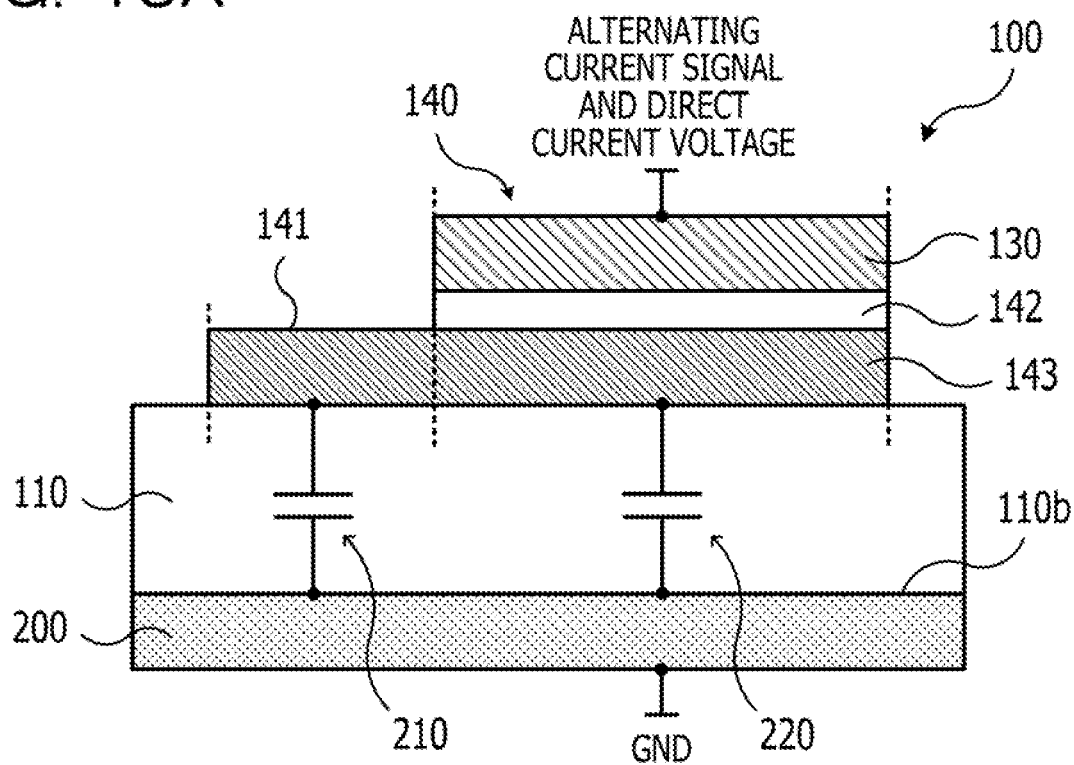
FIGS. 18A and 18B are diagrams (part 1) for describing an effect of suppressing a parasitic component.
Figure 18B:
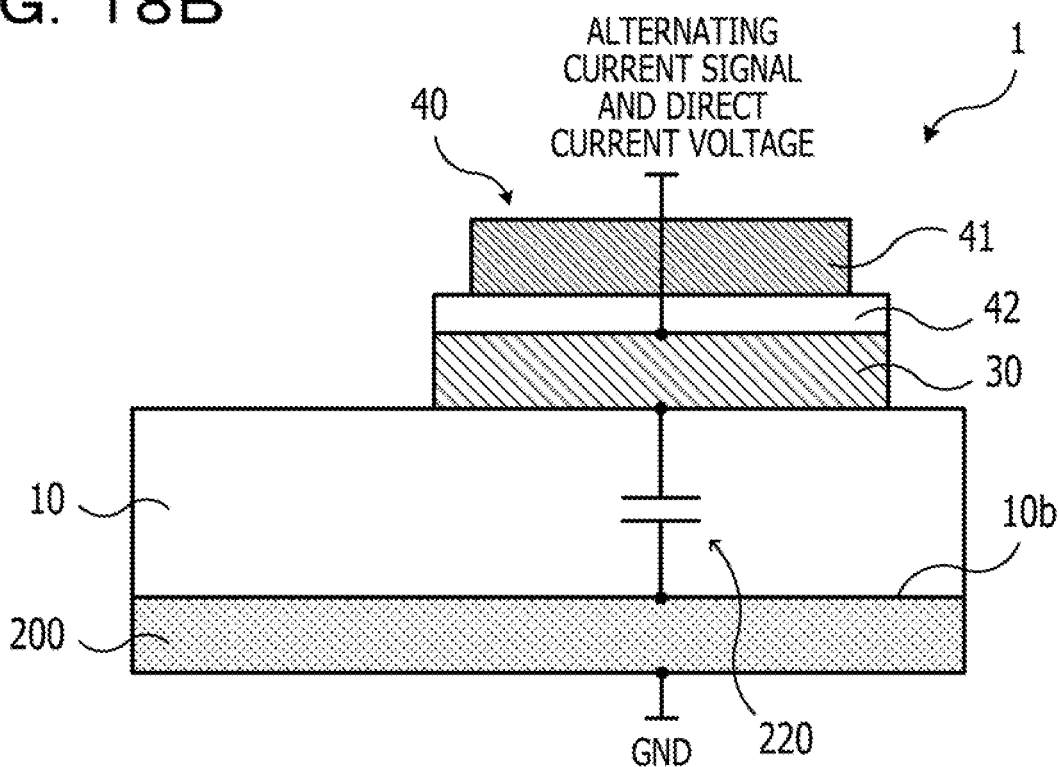

In FIG. 18A, a XVIIIa-XVIIIa cross-sectional view of the semiconductor device 100 illustrated in FIG. 2 is schematically illustrated for comparison. In FIG. 18B, a XVIIIb-XVIIIb cross-sectional view of the semiconductor device 1 illustrated in FIG. 3 is schematically illustrated. In FIG. 18B, the GND conductor on the inner surface of the substrate is additionally illustrated in the same manner as in FIG. 18A.

In the semiconductor device 100 having the configuration illustrated in FIG. 2, the capacitance 140 in which a part of the transmission line 130 functions as the upper electrode and the conductive layer 143 disposed below the upper electrode through the dielectric 142 functions as the lower electrode is disposed as illustrated in FIG. 18A. In the capacitance 140 of the semiconductor device 100, the terminal 141 extracted to the side of the transmission line 130 from the conductive layer 143 is disposed.

In the semiconductor device 100, as illustrated in FIG. 2, the GND conductor 200 is disposed on the inner surface 110b of the substrate 110. The capacitive component corresponding to the sizes of the transmission line 130, the terminal 131, and the GND conductor 200 and the thickness and the like of the interposed substrate 110 occurs between the transmission line 130 and the terminal 131 extending to the circuit element 120 on the input side and the GND conductor 200. The impedance of the transmission line 130 extending from the terminal 131 to the circuit element 120 is adjusted to a predetermined set value (for example, 50Ω) by considering the capacitive component occurring between the transmission line 130 and the GND conductor 200. However, as illustrated in FIG. 2 and FIG. 18A, in the transmission line 130, in a case where the capacitance 140 is disposed for inputting the alternating current signal and cutting the direct current component and the terminal 141 (part that protrudes from a position facing the transmission line 130 acting as the upper electrode) extracted to the side of the transmission line 130 from the conductive layer 143 (part facing the transmission line 130 acting as the upper electrode) acting as the lower electrode is disposed, the following occurs.

For example, the above capacitive component occurs between the transmission line 130 extending from the terminal 131 to the circuit element 120 and the GND conductor 200. In the part of the capacitance 140, an electric signal of the transmission line 130 of the upper electrode is transmitted to the conductive layer 143 of the lower electrode through the relatively thin dielectric 142 in a capacitive and alternating current manner. Thus, a capacitive component equivalent to the capacitive component between the transmission line 130 and the GND conductor 200 occurs between the conductive layer 143 of the lower electrode and the GND conductor 200. In FIG. 18A, the capacitive component occurring between the transmission line 130 and the conductive layer 143 of the lower electrode and the GND conductor 200 is represented as a capacitive component 220. In the transmission line 130 extending from the terminal 131 to the circuit element 120, even in a case where the conductive layer 143 of the lower electrode of the capacitance 140 is disposed, a change in capacitive component 220 between the transmission line 130 and the conductive layer 143 of the lower electrode and the GND conductor 200 is suppressed, and a change in impedance from the set value is suppressed. However, a parasitic component, for example, the parasitic capacitive component 210 illustrated in FIG. 18A, occurs between the terminal 141 of the capacitance 140, which is linked to the conductive layer 143 of the lower electrode to which the electric signal of the transmission line 130 of the upper electrode is transmitted in a capacitive and alternating current manner and is extracted to the side of the transmission line 130, and the GND conductor 200. In the transmission line 130 extending from the terminal 131 to the circuit element 120, the parasitic capacitive component 210 between the terminal 141 extracted from the conductive layer 143 of the lower electrode and the GND conductor 200 is added to the capacitive component 220 between the transmission line 130 and the conductive layer 143 of the lower electrode and the GND conductor 200. In a case where the parasitic capacitive component 210 between the extracted terminal 141 and the GND conductor 200 is added to the capacitive component 220, the impedance, which is adjusted by considering the capacitive component 220, of the transmission line 130 extending from the terminal 131 to the circuit element 120 is changed from the set value. In a case where the impedance is changed from the set value, the input signal input into the terminal 131 at the time of examination is changed while being transmitted through the transmission line 130, and an input signal having an appropriate value may not be transmitted to the circuit element 120. For example, the input signal input into the terminal 131 may not be transmitted to the circuit element 120 as an appropriate value due to a change in proportion of an alternating current component flowing from the transmission line 130 to the GND conductor 200 coupled to the transmission line 130 in a capacitive manner or a change in phase of the transmitted signal.

In the semiconductor device 100, the same applies to the output side. The capacitive component 220 occurs between the transmission line 150 and the conductive layer of the lower electrode of the capacitance 160 and the GND conductor 200 in the transmission line 150 extending from the circuit element 120 to the terminal 151. A parasitic component such as the parasitic capacitive component 210 occurs between the terminal 161 linked to the conductive layer of the lower electrode of the capacitance 160 and the GND conductor 200. Even in the transmission line 150 on the output side, such a parasitic component is added to the capacitive component occurring between the transmission line 150 and the conductive layer of the lower electrode of the capacitance 160 and the GND conductor 200 as described above with respect to the transmission line 130 on the input side. Accordingly, the impedance of the transmission line 150 extending from the circuit element 120 to the terminal 151 is changed from the set value, and the output signal output from the circuit element 120 at the time of examination is changed while being transmitted through the transmission line 150. An output signal having an appropriate value may not be acquired from the terminal 151.

In the semiconductor device 100, the terminal 141 and the terminal 161 which are not used in examination and are disposed for inputting and outputting the alternating current signal at the time of operation after examination may affect signal transmission at the time of examination and hinder appropriate input and output.

Meanwhile, in the semiconductor device 1 having the configuration illustrated in FIG. 3, the capacitance 40 in which a part of the transmission line 30 functions as the lower electrode and the terminal 41 disposed over the lower electrode through the dielectric 42 functions as the upper electrode is disposed as illustrated in FIG. 18B. The terminal 41 of the upper electrode of the capacitance 40 is disposed in a width not protruding from the transmission line 30 of which a part acts as the lower electrode. In the semiconductor device 1, the transmission line 30 is disposed below the terminal 41 of the capacitance 40, and the terminal 41 has a width not protruding from the transmission line 30.

Even in the semiconductor device 1, in a case where the GND conductor 200 is disposed on the inner surface 10b of the substrate 10, the capacitive component 220 occurs between the transmission line 30 and the GND conductor 200 as illustrated in FIG. 18B in the same manner as the semiconductor device 100. The impedance of the transmission line 30 extending from the terminal 31 to the circuit element 20 as illustrated in FIG. 3 is adjusted to a predetermined set value (for example, 50Ω) by considering the capacitive component 220 occurring between the transmission line 30 and the GND conductor 200.

In the semiconductor device 1, as illustrated in FIG. 18B, even in the case where the GND conductor 200 is disposed on the inner surface 10b of the substrate 10, the transmission line 30 having a width in which the terminal 41 does not protrude is arranged between the GND conductor 200 and the terminal 41. The transmission line 30 is coupled to the terminal 41 through the dielectric 42 in a capacitive manner and is coupled to the GND conductor 200 through the substrate 10 in a capacitive manner. The terminal 41 has a width not protruding from the transmission line 30. Thus, the terminal 41 does not face the GND conductor 200 without passing through the transmission line 30. A situation where the state of the terminal 41 to which the electric signal of the transmission line 30 is transmitted in a capacitive and alternating current manner is affected by the GND conductor 200 is suppressed. Capacitive coupling causing the parasitic component between the terminal 41 and the GND conductor 200, for example, electrical joining causing the parasitic capacitive component 210 illustrated in FIG. 18A, is suppressed by the transmission line 30 interposed between the terminal 41 and the GND conductor 200. Occurrence of an excessive parasitic component between the terminal 41 and the GND conductor 200 except for the capacitance 40 and the capacitive component 220 is suppressed.

The terminal 41 of the capacitance 40 is disposed for inputting the alternating current signal by suppressing transmission of the direct current component that may act as a noise at the time of operation after modularization. In the transmission line 30 extending from the terminal 31 to the circuit element 20, addition of the parasitic component caused by the terminal 41 to the capacitive component 220 occurring between the transmission line 30 and the GND conductor 200 is suppressed. In the transmission line 30 extending from the terminal 31 to the circuit element 20, further addition of the parasitic component to the capacitive component 220 between the transmission line 30 and the GND conductor 200 is suppressed. Thus, the impedance which is adjusted to a predetermined set value by considering the capacitive component 220 is suppressed from a change from the set value.

In the semiconductor device 1, the impedance of the transmission line 30 to which the direct current voltage is applied and the alternating current signal is transmitted at the time of examination is suppressed from a change from the set value by the terminal 41 of the capacitance 40 and the GND conductor 200. Accordingly, at the time of examination of the semiconductor device 1, an appropriate input signal may be transmitted to the circuit element 20 through the transmission line 30, and thus, the characteristics of the circuit element 20 may be appropriately evaluated.

In the semiconductor device 1, the same applies to the transmission line 50 on the output side. The transmission line 50 having a width in which the terminal 61 does not protrude is arranged between the GND conductor 200 and the terminal 61 of the capacitance 60, and occurrence of the parasitic component between the GND conductor 200 and the terminal 61 is suppressed. In the semiconductor device 1, the impedance of the transmission line 50 to which the output signal of the circuit element 20 is transmitted is suppressed from a change from the set value by the terminal 61 of the capacitance 60 and the GND conductor 200. Accordingly, at the time of examination of the semiconductor device 1, an appropriate output signal of the circuit element 20 may be acquired through the transmission line 50, and thus, the characteristics of the circuit element 20 may be appropriately evaluated.

In the semiconductor device 100 including the capacitance 140 having the configuration illustrated in FIG. 18A and the capacitance 160 having the same configuration, the impedance may be changed by a few % to a few tens of % at a predetermined frequency at the time of examination of the circuit element 120. For example, the impedance in the case of disposing the conductive layer 143 of the lower electrode and the terminal 141 extracted from the conductive layer 143 in a part of the transmission line 130 through the dielectric 142 is changed by approximately 5% at a frequency of 28 GHz and approximately 30% at 56 GHz with respect to the impedance of the transmission line 130 (not including the dielectric 142, the lower electrode, and the terminal 141) extending from the terminal 131 to the circuit element 120. The impedance in the case of disposing the conductive layer of the lower electrode and the terminal 161 extracted from the conductive layer in a part of the transmission line 150 through the dielectric 162 is changed by approximately 5% at a frequency of 28 GHz and approximately 30% at 56 GHz with respect to the impedance of the transmission line 150 (not including the dielectric 162, the lower electrode, and the terminal 161) extending from the circuit element 120 to the terminal 151. In the semiconductor device 100, the effect of disposing the terminal 141, for example, the effect of the parasitic component occurring between the terminal 141 and the GND conductor 200, appears to be increased as the frequency is increased.

Meanwhile, in the semiconductor device 1 including the capacitance 40 having the configuration illustrated in FIG. 18B and the capacitance 60 having the same configuration, a change in impedance at the time of examination of the circuit element 20 is effectively suppressed at a predetermined frequency. For example, a change in impedance in the case of disposing the terminal 41 of the upper electrode in a part of the transmission line 30 through the dielectric 42 is suppressed to be less than or equal to 0.01% at a frequency of either 28 GHz or 56 GHz with respect to the impedance of the transmission line 30 (not including the dielectric 42 and the terminal 41) extending from the terminal 31 to the circuit element 20. A change in impedance in the case of disposing the terminal 61 of the upper electrode in a part of the transmission line 50 through the dielectric 62 is suppressed to be less than or equal to 0.01% at a frequency of either 28 GHz or 56 GHz with respect to the impedance of the transmission line 50 (not including the dielectric 62 and the terminal 61) extending from the terminal 31 to the circuit element 20. In the semiconductor device 1, the parasitic component occurring between the terminal 41 and the GND conductor 200 is suppressed, and a change in impedance is effectively suppressed regardless of the frequency.

In the semiconductor device 1, a situation where the terminal 41 and the terminal 61 which are not used in examination and are disposed for inputting and outputting the alternating current signal at the time of operation after examination affect signal transmission at the time of examination and hinder appropriate input and output is effectively suppressed.

Figure 19A:
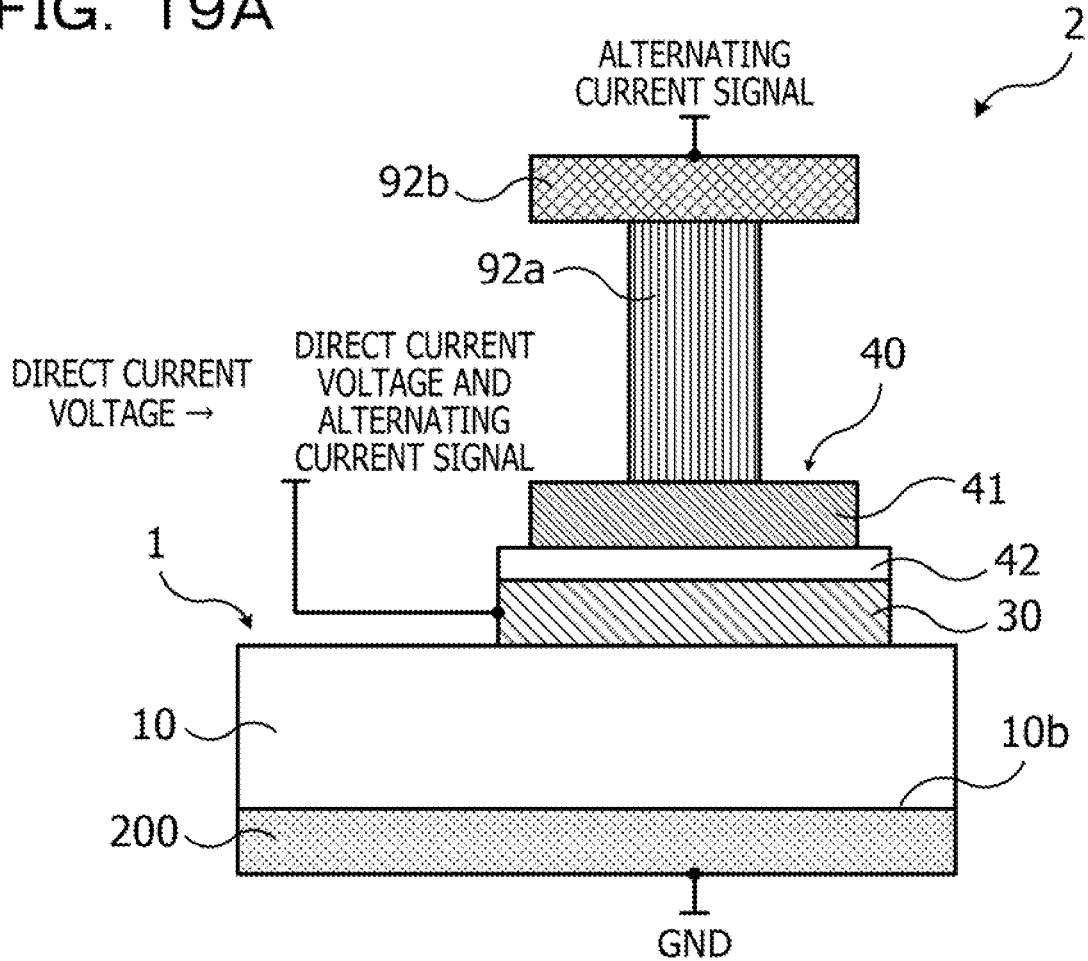
FIGS. 19A and 19B are diagrams (part 2) for describing the effect of suppressing the parasitic component.
Figure 19B:
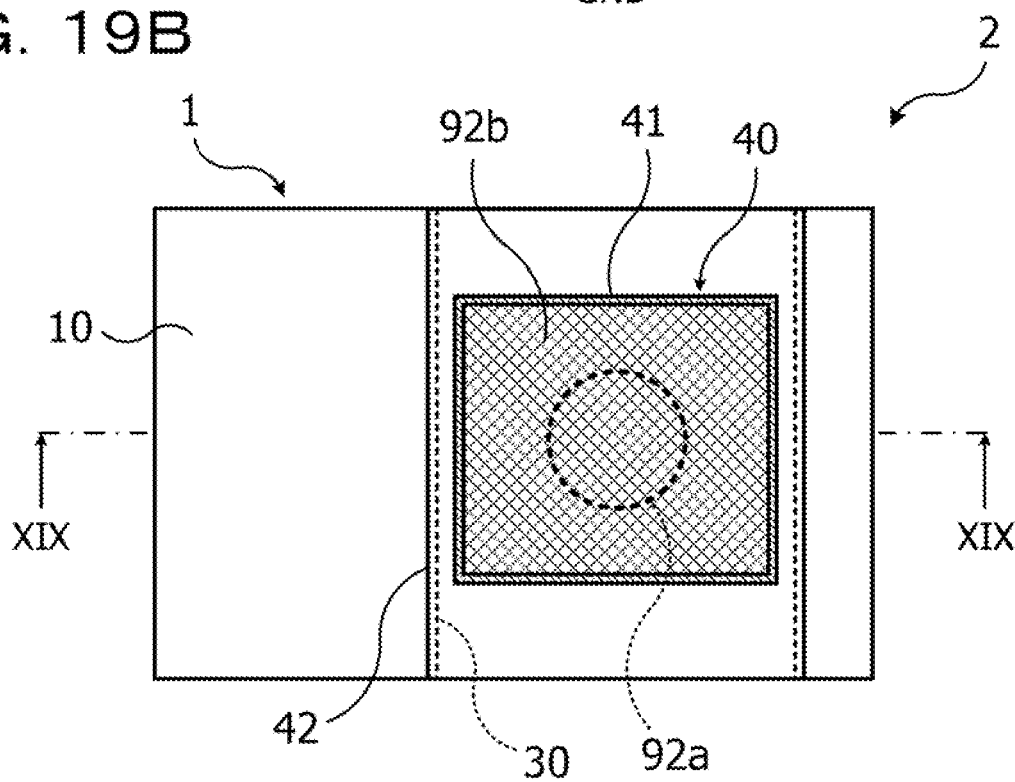

In FIG. 19A, a main cross-sectional view of one example of a state where rewiring is coupled to the terminal 41 of the capacitance 40 of the semiconductor device 1 is schematically illustrated. In FIG. 19B, a main plan view of one example of a state where rewiring is coupled to the terminal 41 of the capacitance 40 of the semiconductor device 1. FIG. 19A is a XIX-XIX cross-sectional view of FIG. 19B.

In the semiconductor module 2 obtained by modularizing the semiconductor device 1, as illustrated in FIG. 19A and FIG. 19B, the via 92a and the wiring 92b which are the rewiring are disposed over the terminal 41 of the capacitance 40 of the semiconductor device 1 acting as the upper electrode. The via 92a is disposed in a width (diameter) that does not protrude from the terminal 41 of the capacitance 40 as illustrated in FIG. 19A and FIG. 19B.

At the time of operation of the semiconductor module 2, the direct current voltage is applied to the transmission line 30, and the alternating current signal is input into the terminal 41 of the capacitance 40 from the wiring 92b through the via 92*a*. The direct current voltage is applied to the transmission line 30 extending from the part of the capacitance 40 to the circuit element 20, and the alternating current signal is transmitted through the transmission line 30. In the semiconductor module 2, even in a case where the GND conductor 200 is disposed on the inner surface 10*b* of the substrate 10, the parasitic component occurring between the GND conductor 200 and the terminal 41 is suppressed by disposing the terminal 41 over the transmission line 30 in a width not protruding from the transmission line 30.

Furthermore, in the semiconductor module 2, the parasitic component occurring between the GND conductor 200 and the via 92*a* is suppressed by disposing the via 92*a* having a width not protruding from the terminal 41 on the terminal 41 disposed in a width not protruding from the transmission line 30. As illustrated in FIG. 19A and FIG. 19B, in a case where the wiring 92*b* over the via 92*a* is disposed in a width not protruding from the terminal 41 or disposed in a width not protruding from the transmission line 30, the parasitic component occurring between the GND conductor 200 and the wiring 92*b* is also suppressed.

In the semiconductor module 2, the impedance of the transmission line 30 to which the direct current voltage is applied and the alternating current signal is transmitted at the time of operation is suppressed from a change by the terminal 41 of the capacitance 40 and the GND conductor 200. Accordingly, at the time of operation of the semiconductor module 2, an appropriate input signal may be transmitted to the circuit element 20 through the transmission line 30, and thus, the circuit element 20 may be appropriately operated.

In the semiconductor module 2, the same applies to the transmission line 50 on the output side. The parasitic component occurring between the GND conductor 200 and the terminal 61 disposed in a width not protruding from the transmission line 50 is suppressed. In the semiconductor module 2, the parasitic component occurring between the GND conductor 200 and the via 94*a* is suppressed by disposing the via 94*a* having a width not protruding from the terminal 61 on the terminal 61 disposed in a width not protruding from the transmission line 50. In a case where the width of the wiring 94*b* over the via 94*a* is appropriately set to a width or the like not protruding from the terminal 61, the parasitic component occurring between the GND conductor 200 and the wiring 94*b* is also suppressed. In the semiconductor module 2, the impedance of the transmission line 50 to which the output signal of the circuit element 20 is transmitted is suppressed from a change by the terminal 61 of the capacitance 60 and the GND conductor 200. Accordingly, at the operation of the semiconductor module 2, the output signal of the circuit element 20 may be appropriately acquired through the transmission line 50.

In the case of the semiconductor device 100 illustrated in FIG. 18A and the like, the alternating current signal is input into the terminal 141 and is output from the terminal 161. However, the impedance of the transmission line 130 extending from the part of the capacitance 140 (the lower electrode, the dielectric 142, and the upper electrode) to the circuit element 120 is changed from the set value due to the parasitic capacitive component 210 occurring between the terminal 141 and the GND conductor 200. Similarly, the impedance of the transmission line 150 extending from the part of the capacitance 160 (the lower electrode, the dielectric 162, and the upper electrode) to the circuit element 120 is changed from the set value due to the parasitic capacitive component 210 occurring between the terminal 161 and the GND conductor 200. Due to the effect of the parasitic component occurring between the terminals 141 and 161 and the GND conductor 200, appropriate input and output may not be performed at the time of operation.

According to the semiconductor device 1 and the semiconductor module 2 described as the first embodiment above, appropriate signal transmission and input and output in which the effect of the parasitic component is suppressed are implemented for the circuit elements 20 inside the semiconductor device 1 and the semiconductor module 2. Accordingly, appropriate evaluation of the characteristics of the circuit element 20 and appropriate operation of the circuit element 20 are implemented.

While an example of operating the semiconductor device 1 after examination by modularizing the semiconductor device 1 into the WLP or the like is illustrated in the above description, the semiconductor device 1 may be operated without modularizing the semiconductor device 1 into the WLP or the like. For example, the semiconductor device 1 after examination may be mounted over an electronic component such as a circuit substrate or another semiconductor device using a solder bump or the like and operated. At this point, the direct current voltage is input into the terminal 31 of the transmission line 30 of the semiconductor device 1, and the alternating current signal is input into the terminal 41 of the capacitance 40 on the transmission line 30. The output from the circuit element 20 is acquired from the terminal 61 of the capacitance 60 on the transmission line 50. Even in such a case, the same effect as described above may be obtained at the time of examination and subsequent operation.

[Second Embodiment]

The semiconductor device 1 and the semiconductor module 2 using the semiconductor device 1 described in the first embodiment may be applied to, for example, a radio communication apparatus (a transmitter or a receiver) that transmits or receives signals. An example of applying the semiconductor device 1 and the semiconductor module 2 to a transmitter will be described as a second embodiment.

Figure 20:
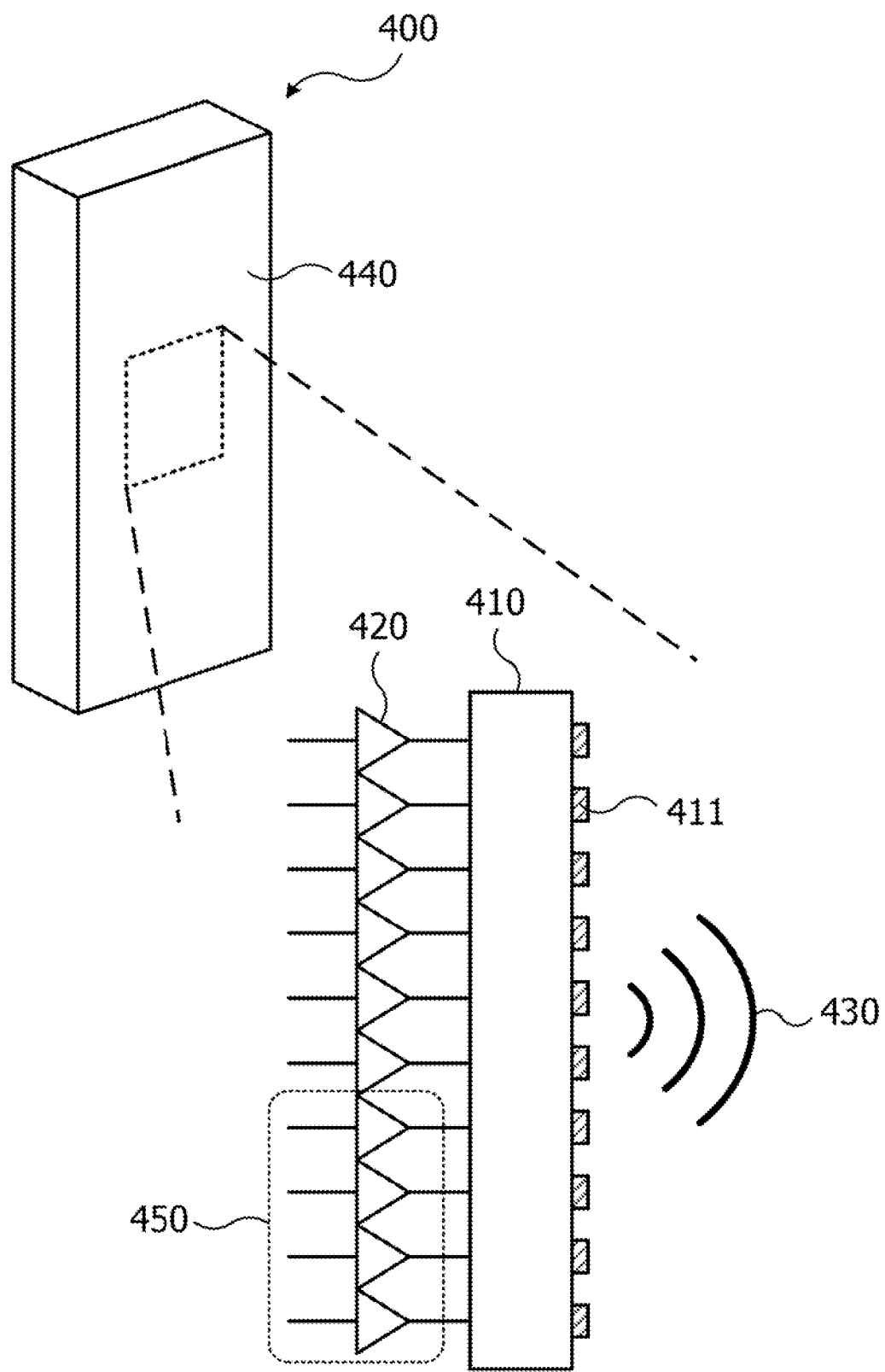
FIG. 20 is a diagram (part 1) for describing one example of a transmitter according to a second embodiment.
Figure 21:
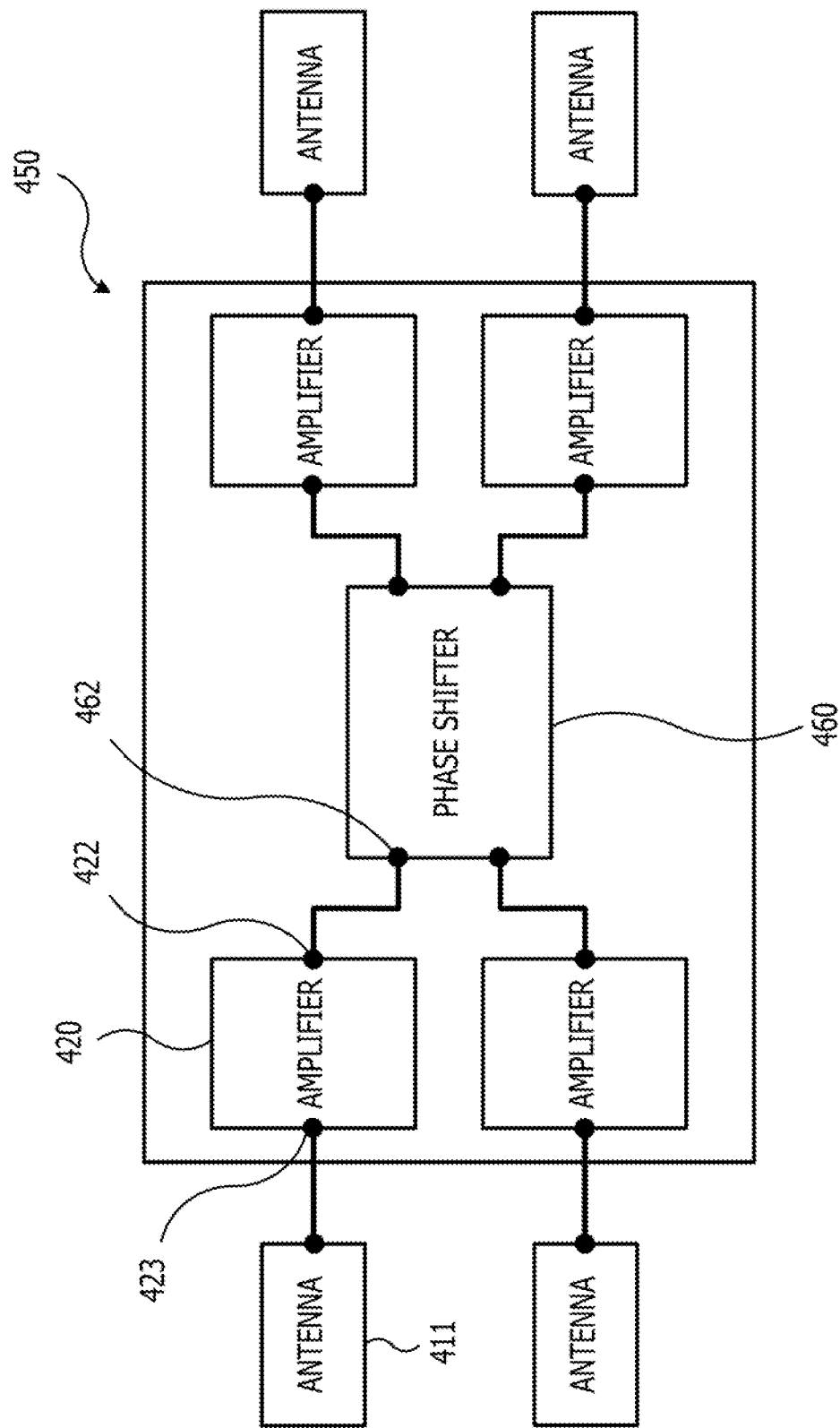
FIG. 21 is a diagram (part 2) for describing one example of the transmitter according to the second embodiment.
Figure 22:
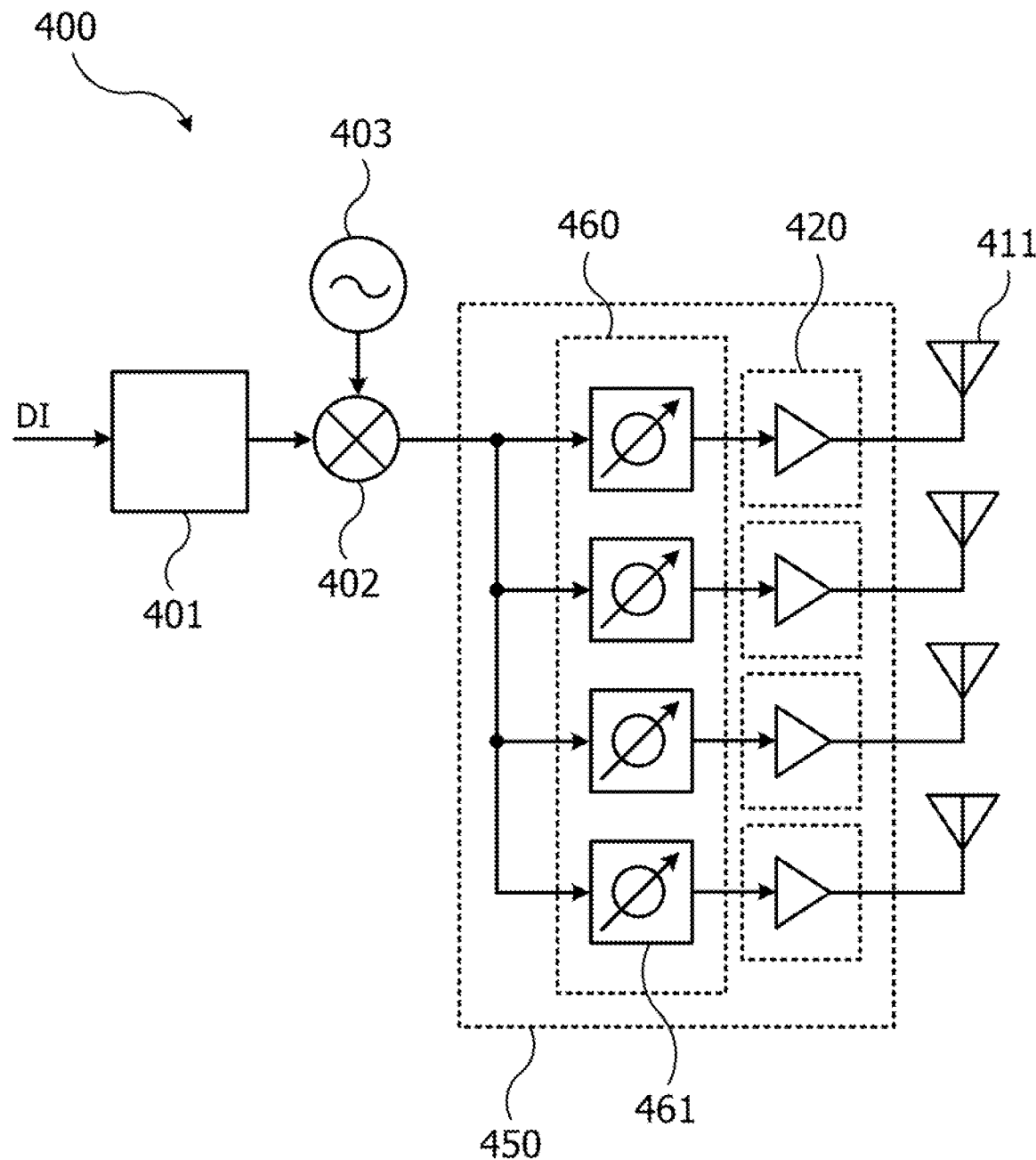
FIG. 22 is a diagram (part 3) for describing one example of the transmitter according to the second embodiment.

FIG. 20 to FIG. 22 are diagrams for describing one example of the transmitter according to the second embodiment. In FIG. 20, a main exterior view and a partial enlarged view of the transmitter are schematically illustrated. In FIG. 21, a configuration example of an amplification module used in the transmitter is illustrated. In FIG. 22, one example of the circuit of the transmitter is illustrated.

For example, a transmitter 400 illustrated in FIG. 20 is a transmitter used for long-distance (greater than 1 km) radio communication in a millimeter wave band or a quasi-millimeter wave band. The transmitter 400 includes a phased array antenna 410 (also called an "antenna substrate") including a plurality of antennas 411 arranged in an array form, and a plurality of amplifiers 420 coupled to the antennas 411 respectively or in units of a few antennas 411. A semiconductor device (semiconductor chip) in which the HEMT using a GaN-based nitride semiconductor material, a so-called GaN-HEMT, is included in an amplification circuit is used in the amplifier 420. The phased array antenna 410 and the amplifier 420 are mounted in a casing 440 of the transmitter 400 such that a radio signal 430 may be transmitted from the antennas 411.

For example, the plurality of amplifiers 420 are mounted in the transmitter 400 by modularizing a certain number of amplifiers 420 into one by the WLP process. One example of the modularized certain number of amplifiers 420 (referred to as an "amplification module") is illustrated in FIG. 21.

An amplification module 450 illustrated in FIG. 21 includes four amplifiers 420 and one phase shifter 460 coupled to the four amplifiers 420. A semiconductor device (semiconductor chip) is used in the phase shifter 460. For example, these amplifiers 420 and the phase shifter 460 are modularized into one amplification module 450 in accordance with the example of the WLP process illustrated in FIGS. 15A to 15E.

The amplifier 420 is one aspect of the semiconductor device 1 described in the first embodiment. In the amplifier 420, for example, configurations described as the circuit element 20, the transmission lines 30 and 50, and the capacitance 40 and 60 in the first embodiment are employed for a circuit element, transmission lines, and capacitance disposed inside the amplifier 420. In the same manner as the amplifier 420, the configuration of the semiconductor device 1 described in the first embodiment may also be employed in the phase shifter 460. The amplification module 450 obtained by modularizing the amplifier 420 is one aspect of the semiconductor module 2 described in the first embodiment. In the amplification module 450, for example, configurations described as the resin layer 80 and the rewiring layer 90 in the first embodiment are employed as a resin layer and a rewiring layer of the amplification module 450.

As illustrated in FIG. 21, in the amplification module 450, an output terminal 462 of the phase shifter 460 is coupled to a terminal 422 (corresponding to the terminal 41) of capacitance (corresponding to the capacitance 40) over a transmission line (corresponding to the transmission line 30) coupled to an input side of a circuit element (corresponding to the circuit element 20) inside the amplifier 420. The antenna 411 is coupled to a terminal 423 (corresponding to the terminal 61) of capacitance (corresponding to the capacitance 60) over a transmission line (corresponding to the transmission line 50) coupled to an output side of the circuit element (corresponding to the circuit element 20) inside the amplifier 420.

In the case of forming the amplification module 450 illustrated in FIG. 21, four amplifiers 420 and one phase shifter 460 are set as one set, and one or a plurality of sets are arranged over a support in accordance with the example in FIG. 15A and are embedded in a resin layer in accordance with the example in FIG. 15B. A rewiring layer including rewiring that couples four amplifiers 420 and one phase shifter 460 corresponding to one set, and rewiring for coupling the four amplifiers 420 to one or a plurality of antennas 411 is formed over a surface after separation of the support in accordance with the examples in FIG. 15C and FIG. 15D. Then, dicing is performed at a predetermined position in accordance with the example in FIG. 15E, and each individual amplification module 450 including four amplifiers 420 and one phase shifter 460 corresponding to one set is formed.

One example of the circuit of the transmitter 400 in which the amplification module 450 including the plurality of amplifiers 420 and the phased array antenna 410 including the plurality of antennas 411 are mounted is illustrated in FIG. 22.

For example, as illustrated in FIG. 22, the transmitter 400 includes a baseband circuit 401, an up-converter 402, an oscillator 403, the amplification module 450, and the antennas 411 of the phased array antenna 410. The amplification module 450 includes the plurality of amplifiers 420 and the phase shifter 460. For example, the phase shifter 460 includes a plurality of phase shifter units 461 disposed in correspondence with the plurality of amplifiers 420.

In a case where data DI (digital signal) to be transmitted is input, the baseband circuit 401 generates a baseband signal (analog signal) based on the data DI. The up-converter 402 converts (up-converts) the baseband signal into a signal having a predetermined frequency by multiplying the baseband signal generated by the baseband circuit 401 by an oscillation signal generated by the oscillator 403. The signal converted by the up-converter 402 is input into the amplification module 450 and is distributed to each of the plurality of phase shifter units 461 of the phase shifter 460. Each phase shifter unit 461 adjusts the phase of the input signal and outputs a signal of which the phase is shifted by a certain angle. The signals output from the phase shifter units 461 are input into the amplifiers 420, respectively. The amplifiers 420 amplify the input signals and output the amplified signals to the antennas 411 (or a group of antennas 411), respectively. The signals input into the antennas 411 are radiated to a space from the antennas 411 and are transmitted as the beamformed radio signal 430 (FIG. 20).

In the transmitter 400, the configuration of the semiconductor device 1 described in the first embodiment is employed for each of the plurality of amplifiers 420 in the amplification module 450. Accordingly, in examination before modularization of the plurality of amplifiers 420, appropriate signal transmission and input and output in which the effect of the parasitic component is suppressed may be performed for the circuit element (corresponding to the circuit element 20) inside each amplifier 420, and the characteristics of the circuit element may be appropriately evaluated. In the amplification module 450 obtained by modularizing the plurality of amplifiers 420, appropriate signal transmission and input and output in which the effect of the parasitic component is suppressed may be performed for the amplifiers 420 (circuit elements inside the amplifiers 420), and the amplifiers 420 may be appropriately operated. In a case where the configuration of the semiconductor device 1 described in the first embodiment is employed in the phase shifter 460, the same effect as described above is obtained for the phase shifter 460 and the phase shifter 460 in the amplification module 450.

Accordingly, the amplifiers 420 of high performance and high quality and the amplification module 450 using the amplifiers 420 are implemented. Furthermore, the transmitter 400 of high performance and high quality using the amplification module 450 is implemented.

The amplification module 450 may be formed as one module (also called an "antenna integration type amplifier") by coupling and integrating the antennas 411 with the amplifiers 420, and such a module may be mounted in the transmitter 400.

While an example of applying the semiconductor device 1 and the semiconductor module 2 described in the first embodiment to the transmitter is illustrated, the semiconductor device 1 and the semiconductor module 2 may also be applied to a receiver. In this case, an antenna that receives a radio signal from the outside is coupled to a terminal (corresponding to the terminal 41) of capacitance (corresponding to the capacitance 40) over a transmission line (corresponding to the transmission line 30) coupled to an input side of a circuit element (corresponding to the circuit element 20) inside a modularized amplifier.

The signal (analog signal) received by the antenna is input into an amplifier such as a low-noise amplifier and amplified, and the signal amplified by the amplifier is converted into data (digital signal) by converting (down-converting) the signal into a signal having a predetermined frequency by a down-converter. Even in the receiver, by using the amplifier and the amplification module having the configurations of the semiconductor device 1 and the semiconductor module 2 described in the first embodiment, appropriate characteristic evaluation and operation may be performed, and a receiver of high performance and high quality is implemented.

In the semiconductor device 1 and the semiconductor module 2 using the semiconductor device 1 described in the first embodiment, the circuit element 20 disposed inside the semiconductor device 1 may have functions such as switching and oscillation instead of the function of amplification or together with the function of amplification. The semiconductor device 1 and the semiconductor module 2 are not limited to the transmitter and the receiver having the configurations described in the second embodiment and may be applied to various electronic devices, for example, various electronic devices such as a computer (a personal computer, a supercomputer, a server, or the like), a smartphone, a mobile phone, a tablet terminal, a sensor, a camera, an audio device, a measurement device, an examination device, and a manufacturing device.

The following appendix will be further disclosed with respect to the embodiments.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of operating a semiconductor device including:
    a substrate,
    a circuit element disposed on a first surface side of the substrate,
    a first terminal that is disposed over the first surface side of the substrate and into which a first direct current voltage and a first alternating current signal for examination or a second direct current voltage for operation are input,
    a first transmission line that has a first end coupled to the circuit element and a second end coupled to the first terminal and is disposed on the first surface side of the substrate in such a manner that the first transmission line is continuously in contact with the substrate between the first terminal and the circuit element,
    a first dielectric that is disposed in a part of the first transmission line on a side opposite to the substrate in such a manner that the first dielectric is in contact with the first transmission line,
    a second terminal that is disposed on a side of the first dielectric opposite to the first transmission line so as not to protrude from the first transmission line in a plan view and into which a second alternating current signal for operation is input,
    a third terminal that is disposed on the first surface side of the substrate and from which a first output signal of the circuit element at a time of input of the first direct current voltage and the first alternating current signal into the first terminal is output,
    a second transmission line that has a third end coupled to the circuit element and a fourth end coupled to the third terminal and is disposed on the first surface side of the substrate in such a manner that the first transmission line is continuously in contact with the substrate between the third terminal and the circuit element,
    a second dielectric that is disposed in a part of the second transmission line on a side opposite to the substrate in such a manner that the second dielectric is in contact with the second transmission line,
    a fourth terminal that is disposed on a side of the second dielectric opposite to the second transmission line so as not to protrude from the second transmission line in a plan view and from which a second output signal of the circuit element at a time of input of the second direct current voltage into the first terminal and input of the second alternating current signal into the second terminal is output, and
    a conductor that is disposed on a second surface side of the substrate opposite to the first surface and set to a ground electric potential,
    the method comprising:
    inputting the first direct current voltage and the first alternating current signal into the first terminal and acquiring the first output signal of the circuit element from the third terminal at a time of examination of the semiconductor device; and
    inputting the second direct current voltage into the first terminal, inputting the second alternating current signal into the second terminal, and acquiring the second output signal of the circuit element from the fourth terminal at a time of operation after the examination.

* * * * *